US011677058B2

(12) United States Patent
Park et al.

(10) Patent No.: US 11,677,058 B2
(45) Date of Patent: Jun. 13, 2023

(54) DISPLAY DEVICE

(71) Applicant: Samsung Display Co., Ltd., Yongin-si (KR)

(72) Inventors: Yong Sung Park, Yongin-si (KR); Hyun Woo Kim, Yongin-si (KR); Dae Hyun Noh, Yongin-si (KR); Seung Bin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 17/176,996

(22) Filed: Feb. 16, 2021

(65) Prior Publication Data

US 2021/0367122 A1 Nov. 25, 2021

(30) Foreign Application Priority Data

May 20, 2020 (KR) ........................ 10-2020-0060556

(51) Int. Cl.
*H01L 33/62* (2010.01)
*H01L 27/15* (2006.01)
*G09G 3/32* (2016.01)

(52) U.S. Cl.
CPC .............. *H01L 33/62* (2013.01); *G09G 3/32* (2013.01); *H01L 27/156* (2013.01)

(58) Field of Classification Search
CPC ... H01L 33/62; H01L 27/156; H01L 25/0753; H01L 27/3246; H01L 27/3276; H01L 27/323; G09G 2300/0426; G09G 3/3266; G09G 2300/0819; G09G 2300/0842; G09G 2300/0861; G09G 3/32; G09G 2320/0223; G09G 2320/0233; G09G 2320/0238; G09G 3/3233; G09G 3/3225; G09F 9/33

See application file for complete search history.

(56) References Cited

U.S. PATENT DOCUMENTS

| 10,559,253 B1* | 2/2020 | Li ........................ G09G 3/3225 |
| 2016/0111040 A1* | 4/2016 | Kim ..................... G09G 3/2096 257/773 |
| 2019/0146621 A1* | 5/2019 | Aoki ................... G06F 3/04164 345/174 |

(Continued)

FOREIGN PATENT DOCUMENTS

KR  10-2019-0114066 A   10/2019

*Primary Examiner* — Victor A Mandala
(74) *Attorney, Agent, or Firm* — Lewis Roca Rothgerber Christie LLP

(57) ABSTRACT

A display device includes a substrate. The substrate has a trench portion recessed inward at a side, and includes a first display area, a second display area and a third display area, the second and third display areas being protruded from a first side of the first display area with the trench portion interposed therebetween, and a peripheral area around the display area. First gate lines, second gate lines, and third gate lines are respectively on the first display area, the second display area, and the third display area, and are respectively coupled to first pixels, second pixels, and third pixels. First, second, and third gate drivers are respectively to sequentially provide first gate signals, second gate signals, and third gate signals to the first gate lines, second gate lines, and third gate lines. The third gate driver is on the peripheral area between the third and second display areas.

20 Claims, 10 Drawing Sheets

(56) References Cited

U.S. PATENT DOCUMENTS

| | | | |
|---|---|---|---|
| 2019/0304366 A1* | 10/2019 | Ka | H01L 27/3276 |
| 2020/0089350 A1* | 3/2020 | Han | G06F 3/0448 |
| 2020/0089355 A1* | 3/2020 | Moon | G06F 3/0412 |
| 2020/0271985 A1* | 8/2020 | Adachi | G02F 1/13452 |
| 2021/0151542 A1* | 5/2021 | Choe | H01L 27/3265 |
| 2021/0201802 A1* | 7/2021 | Yi | G09G 3/3233 |

* cited by examiner

DISPLAY DEVICE

CROSS-REFERENCE TO RELATED APPLICATION

This application claims priority to and the benefit of Korean Patent Application No. 10-2020-0060556, filed on May 20, 2020, the entire content of which is hereby incorporated by reference.

BACKGROUND

1. Field

The present disclosure relates to a display device.

2. Description of the Related Art

A display device may be divided into a display area where pixels are disposed and a non-display area where pixels are not disposed. As the display area is larger, the display device can display a larger image, and improve aesthetics. Therefore, a narrow bezel design in which the non-display area is reduced, and a bezel-less design in which the non-display area is removed, have been in a spotlight.

A load matching capacitor for overcoming an RC delay (e.g., resistive-capacitive delay) difference of signals depending on a load difference for each position, and drivers for controlling pixels, are mounted in the non-display area, but it becomes difficult to mount the drivers and the load matching capacitor because the non-display area is reduced.

SUMMARY

An example embodiment of the present disclosure provides a display device capable of sufficiently securing a mounting space (e.g., capable of providing a sufficient mounting space) of a load matching capacitor.

A display device according to an example embodiment of the present disclosure includes a substrate which has a trench portion recessed inward at a side, and which includes a display area including a first display area, a second display area and a third display area, the second and third display areas being protruded from a first side of the first display area with the trench portion interposed therebetween, and a peripheral area around the display area; first pixels on the first display area; second pixels on the second display area; third pixels on the third display area; first gate lines on the first display area and coupled to the first pixels; second gate lines on the second display area and coupled to the second pixels; third gate lines on the third display area and coupled to the third pixels; a first gate driver to sequentially provide first gate signals to the first gate lines; a second gate driver to sequentially provide second gate signals to the second gate lines; and a third gate driver to sequentially provide third gate signals to the third gate lines, wherein the third gate driver is on the peripheral area between the second display area and the third display area.

In an example embodiment, the first gate lines, the second gate lines, and the third gate lines extend in a first direction, and the second display area and the third display area may be spaced apart from each other in the first direction.

In an example embodiment, the display device may further include a first control line extending through the peripheral area between the second display area and the third display area and coupled to the second gate driver and the third gate driver.

In an example embodiment, the second gate driver may be to generate a second gate signal of the second gate signals corresponding to a first start pulse utilizing first clock signals provided through the first control lines, and the third gate driver may be to generate a third gate signal of the third gate signals corresponding to a second start pulse utilizing the first clock signals provided through the first control lines.

In an example embodiment, the second start pulse may be the same as the first start pulse, and the second start pulse may be provided to the third gate driver through one of the first control lines.

In an example embodiment, the second gate lines and the third gate lines may be separated from each other with the trench portion interposed therebetween.

In an example embodiment, the display device may further include fourth gate lines on the first display area and coupled to the first pixels; fifth gate lines on the second display area and coupled to the second pixels; sixth gate lines on the third display area and coupled to the third pixels; connection lines on the peripheral area between the second display area and the third display area and coupling the fifth gate lines and the sixth gate lines with each other; and a fourth gate driver to sequentially provide fourth gate signals to the fifth gate lines and the fourth gate lines.

In an example embodiment, the display device may further include a dummy pattern overlapping the connection lines to form a capacitor.

In an example embodiment, the display device may further include a power supply line commonly coupled to the first pixels, the second pixels, and the third pixels, and the dummy pattern may be coupled to the power supply line.

In an example embodiment, the display device may further include a fifth gate driver to sequentially provide fifth gate signals to the sixth gate lines and the fourth gate lines.

In an example embodiment, the fourth gate driver may be adjacent to a second side of the first display area and a second side of the second display area, and the fifth gate driver may be adjacent to a third side of the first display area and a third side of the third display area.

In an example embodiment, the display device may further include seventh gate lines on the first display area and coupled to the first pixels; eighth gate lines on the second display area and coupled to the second pixels; ninth gate lines on the third display area and coupled to the third pixels; a sixth gate driver to sequentially provide sixth gate signals to the seventh gate lines; a seventh gate driver to sequentially provide seventh gate signals to the ninth gate lines; and an eighth gate driver to sequentially provide eighth gate signals to the eighth gate lines, and the eighth gate driver may be on the peripheral area between the second display area and the third display area.

In an example embodiment, the second gate driver may be adjacent to a second side of the second display area, the third gate driver may be adjacent to a second side of the third display area, and the seventh gate driver may be adjacent to a third side of the third display area, and the eighth gate driver may be adjacent to a third side of the second display area.

In an example embodiment, the display device may further include second control lines extending through the peripheral area between the second display area and the third display area, and coupled to the seventh gate driver and the eighth gate driver.

In an example embodiment, the seventh gate driver may be to generate a seventh gate signal of the seventh gate signals corresponding to a third start pulse utilizing the second clock signals provided through the second control lines, and the eighth gate driver may be to generate an eighth gate signal of the eighth gate signals corresponding to a fourth start pulse utilizing the second clock signals provided through the second control lines.

In an example embodiment, the fourth start pulse may be the same as the third start pulse, and the fourth start pulse may be provided to the eighth gate driver through one of the second control lines.

In an example embodiment, the display device may further includes a first data line, a first power supply line, a second power supply line, and a first initialization line, and a first pixel, which is one of the first pixels, may include a light emitting element coupled to both and being between the first power supply line and the second power supply line; a driving transistor to transfer a driving current to the light emitting element and including a first electrode, a second electrode, and a gate electrode; a switching transistor including a first electrode coupled to the first data line, a second electrode coupled to the first electrode of the driving transistor, and a gate electrode coupled to one of the fourth gate lines; a compensation transistor including a first electrode coupled to the second electrode of the driving transistor, a second electrode coupled to the gate electrode of the driving transistor, and a gate electrode coupled to one of the first gate lines; and an initialization transistor including a first electrode coupled to the gate electrode of the driving transistor, a second electrode coupled to the first initialization line, and a gate electrode coupled to one of the seventh gate lines.

In an example embodiment, the display device may further includes a third power supply line, and the first pixel may further include a first bypass transistor including a first electrode coupled to the third power supply line, a second electrode coupled to the first electrode of the driving transistor, and a gate electrode coupled to one of the first gate lines; and a first light emission transistor including a first electrode coupled to the first power supply line, a second electrode coupled to the first electrode of the driving transistor, and a gate electrode coupled to one of the seventh gate lines.

In an example embodiment, the display device may further includes a second initialization line, and the first pixel may further include a second light emission transistor including a first electrode coupled to the second electrode of the driving transistor, a second electrode coupled to an anode electrode of the light emitting element, and a gate electrode coupled to one of the seventh gate lines; and a second bypass transistor including a first electrode coupled to the anode electrode of the light emitting element, a second electrode coupled to the second initialization line, and a gate electrode coupled to one of the first gate lines.

A display device according to an example embodiment of the present disclosure includes a substrate including a first display area, a second display area and a third display area, the second and third display areas being protruded from a first side of the first display area and spaced apart from each other, and a peripheral area between the second display area and the third display area; first pixels on the first display area; second pixels on the second display area; third pixels on the third display area; first gate lines on the first display area and coupled to the first pixels; second gate lines on the second display area and coupled to the second pixels; third gate lines on the third display area and coupled to the third pixels; a first gate driver to sequentially provide first gate signals to the first gate lines; a second gate driver to sequentially provide second gate signals to the second gate lines; and a third gate driver to sequentially provide third gate signals to the third gate lines. The third gate driver may be on the peripheral area between the second display area and the third display area.

The display device according to example embodiments of the present disclosure may include the peripheral area between the second and third display areas spaced apart from each other at one side of the first display area, and may include a gate driver providing gate signals to the second display area or the third display area. Accordingly, lines on the peripheral area to transfer gate signals from the outside of the second display area and the third display area to the second display area or the third display area become unnecessary, and a mounting space of the load matching capacitor for compensating a load difference between the signal lines can be sufficiently secured in the peripheral area between the second pixel area and third pixel area.

In addition, because securing the mounting space, the lines provided on the peripheral area between the second and third display areas may not overlap each other, and may be spaced apart from each other with a sufficient distance, and thus, interference effects between the lines and a probability of an occurrence of defects can be reduced.

Aspects and features of example embodiments of the present disclosure are not limited by what is illustrated and described in the above, and other aspects and features are included in the present specification.

DETAILED DESCRIPTION

Figure 1:
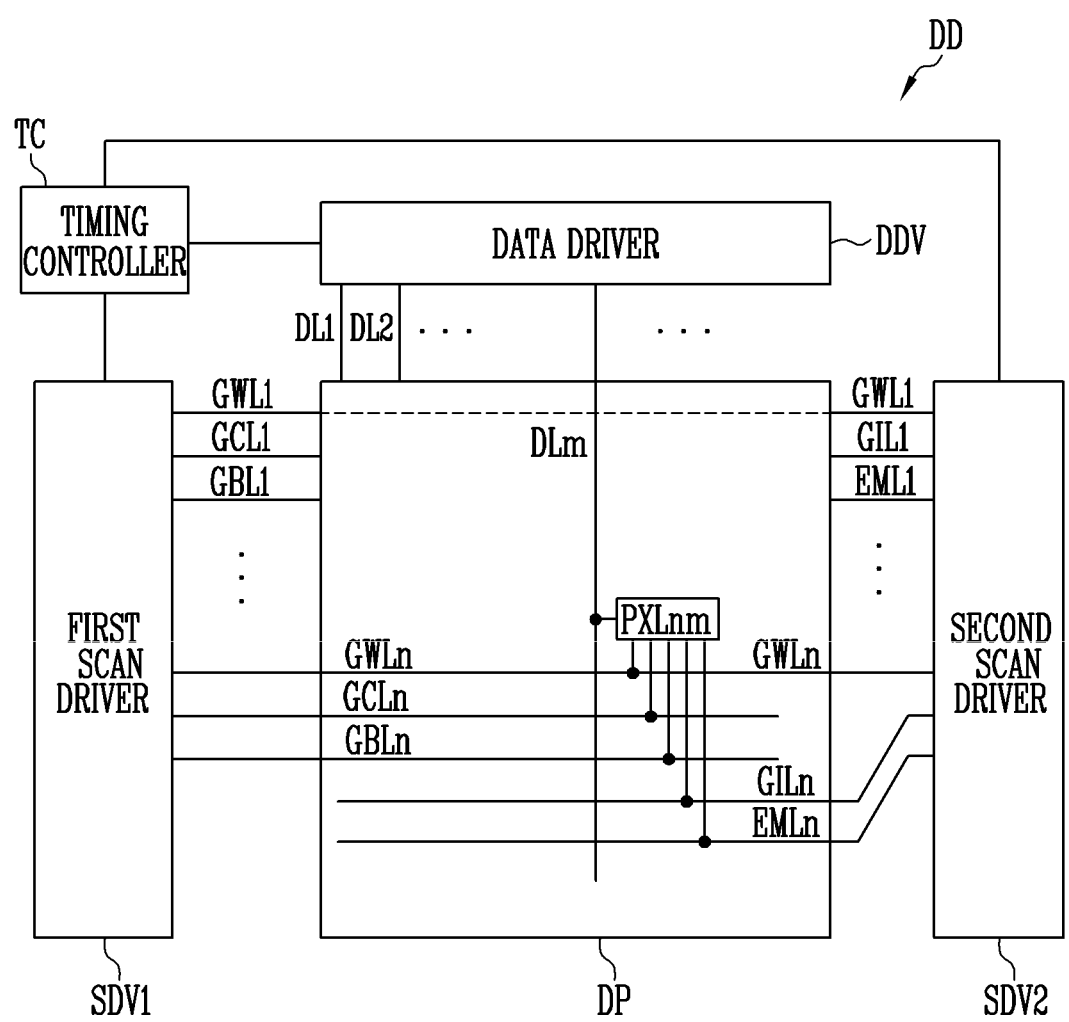
FIG. 1 is a block diagram showing a display device according to an example embodiment of the present disclosure.

Hereinafter, with reference to the accompanying drawings, various example embodiments of the present disclosure will be described in more detail so that those of ordinary skill in the art can easily carry out (e.g., practice) the present disclosure. The present disclosure may be embodied in many different and suitable forms and is not limited to the example embodiments described herein. As used herein, the use of the term "may," when describing embodiments of the present disclosure, refers to "one or more embodiments of the present disclosure." As used herein, the singular forms "a", "an" and "the" are intended to include the plural forms as well, unless the context clearly indicates otherwise.

In order to clearly illustrate the present disclosure, parts that are not related to the description may be omitted, and the same or similar constituent elements are given the same reference numerals throughout the specification. Therefore, the above-mentioned reference numerals can be used in other drawings.

In addition, because the size and thickness of each configuration shown in the drawing may be exaggerated for better understanding and ease of description, the present disclosure is not limited by the illustrated configurations. In the drawings, the dimensions of layers and regions may be exaggerated for clarity of illustration. As used herein, the term "substantially," "about," "approximately," and similar terms are used as terms of approximation and not as terms of degree, and are intended to account for the inherent deviations in measured or calculated values that would be recognized by those of ordinary skill in the art.

FIG. 1 is a block diagram showing a display device according to an example embodiment of the present disclosure.

Referring to FIG. 1, a display device DD includes a timing controller TC, a data driver DDV, a first scan driver SDV1, a second scan driver SDV2, and a display unit DP (or display panel).

The timing controller TC may receive an external input signal from an external processor. Here, the external input signal may include a vertical synchronization signal, a horizontal synchronization signal, a data enable signal, RGB data, and a clock signal.

The vertical synchronization signal may include a plurality of pulses, and may indicate that the previous frame period ends and the current frame period starts with respect to a time point at which each pulse is generated. An interval between adjacent pulses of the vertical synchronization signal may correspond to one frame period. The horizontal synchronization signal may include a plurality of pulses, and may indicate that the previous horizontal period ends and a new horizontal period starts with respect to a time point at which each pulse is generated. An interval between adjacent pulses of the horizontal synchronization signal may correspond to one horizontal period. The data enable signal may indicate that the RGB data is supplied in a horizontal period. For example, in response to the data enable signal, the RGB data may be supplied in units of pixel rows (e.g., pixels coupled (e.g., connected) to the same write scan line) in horizontal periods.

The timing controller TC may generate grayscale values based on the RGB data to correspond to the specification of the display device DD. For example, the grayscale values may refer to RGB data rearranged corresponding to the resolution of the display unit DP.

In addition, the timing controller TC may generate control signals for the data driver DDV, the first scan driver SDV1, and the second scan driver SDV2 based on the external input signal to correspond to the specification of the display device DD.

The data driver DDV may generate data voltages (or data signals) utilizing grayscale values and control signals received from the timing controller TC, and may provide the data voltages to the data lines DL1, DL2, and DLm. Here, m may be a natural number. For example, the data driver DDV may sample the grayscale values utilizing a clock signal, may generate data voltages corresponding to the grayscale values, and may supply the data voltages to the data lines DL1, DL2, and DLm in units of pixel rows.

The first scan driver SDV1 may receive control signals from the timing controller TC, may generate scan signals (or gate signals) based on the control signals, and may provide the scan signals to scan lines GWL1, GCL1, GBL1, GWLn, GCLn, GBLn. Here, n may be a natural number.

In embodiments, the first scan driver SDV1 may include a first write scan driver, a compensation scan driver, and a bypass scan driver.

The first write scan driver may be in the form of a shift register, and may include a plurality of write stages coupled (e.g., connected) to write carry lines. In response to a write start signal received from the timing controller TC, the write stages may sequentially generate write carry signals. Depending on the write start signal and the write carry signals, the write stages may sequentially generate write scan signals of a turn-on level. The write scan signals of the turn-on level may be provided to corresponding write scan lines GWL1 and GWLn. The compensation scan driver may be in the form of a shift register, and may include a plurality of compensation stages coupled (e.g., connected) to compensation carry lines. In response to a compensation start signal received from the timing controller TC, the compensation stages may sequentially generate compensation carry signals. Depending on the compensation start signal and the compensation carry signals, the compensation stages may sequentially generate compensation scan signals of a turn-on level. The compensation scan signals of the turn-on level may be provided to corresponding compensation scan lines GCL1 and GCLn.

The bypass scan driver may be in the form of a shift register, and may include a plurality of bypass stages coupled (e.g., connected) to bypass carry lines. In response to a bypass start signal received from the timing controller TC, the bypass stages may sequentially generate bypass carry signals. Depending on the bypass start signal and bypass carry signals, the bypass stages may sequentially generate bypass scan signals of a turn-on level. The bypass scan signals of the turn-on level may be provided to corresponding bypass scan lines GBL1 and GBLn.

Example configurations of the first write scan driver, the compensation scan driver, and the bypass scan driver will be described later with reference to FIG. 6.

The second scan driver SDV2 may receive control signals from the timing controller TC, may generate scan signals based on the control signals, and may provide the scan signals to scan lines GWL1, GIL1, EML1, GWLn, GILn, and EMLn.

In embodiments, the second scan driver SDV2 may include a second write scan driver, an initialization scan driver, and a light emission scan driver.

The second write scan driver may be substantially the same as or similar to the first write scan driver. The second write scan driver may sequentially generate write scan signals of a turn-on level, and the write scan signals of the turn-on level may be provided to corresponding write scan lines GWL1 and GWLn.

The initialization scan driver may be in the form of a shift register, and may include a plurality of initialization stages coupled (e.g., connected) to initialization carry lines. In response to a initialization start signal received from the timing controller TC, the initialization stages may sequentially generate initialization carry signals. Depending on the initialization start signal and the initialization carry signals, the initialization stages may sequentially generate initialization scan signals of a turn-on level. The initialization scan signals of the turn-on level may be provided to corresponding initialization scan lines GIL1 and GILn.

The light emission scan driver may be in the form of a shift register, and may include a plurality of light emission stages coupled (e.g., connected) to light emission carry lines. In response to a light emission stop signal received from the timing controller TC, the light emission stages may sequentially generate light emission carry signals. According to the light emission stop signal and the light emission carry signals, the light emission stages may sequentially generate light emission scan signals of a turn-off level. The light emission scan signals of the turn-off level may be provided to corresponding light emission scan lines EML1 and EMLn.

Example configurations of the second write scan driver, the initialization scan driver, and the light emission scan driver will be described later with reference to FIG. 9.

The display unit DP includes pixels. For example, the pixel PXLnm includes data lines DLm, write scan lines GWLn, compensation scan lines GCLn, bypass scan lines GBLn, initialization scan lines GILn, and light emission scan lines EMLn corresponding thereto.

In an example embodiment, the write scan lines GWL1 and GWLn may be coupled (e.g., connected) to the write stages of the first scan driver SDV1 and to the write stages of the second scan driver SDV2, and the write scan signals may be applied to the scan lines GWL1 and GWLn from both sides of the display unit DP (e.g., from both the first scan driver SDV1 and from the second scan driver SDV2). Accordingly, RC delay of the write scan signals can be minimized or reduced.

The first scan driver SDV1 may include the compensation stages and the bypass stages, and the second scan driver SDV2 may include the initialization stages and the light emission stages. Therefore, stages necessary for controlling the pixels can be dispersedly arranged on both sides of the display unit DP, and the bezel can be minimized or reduced.

Figure 2:
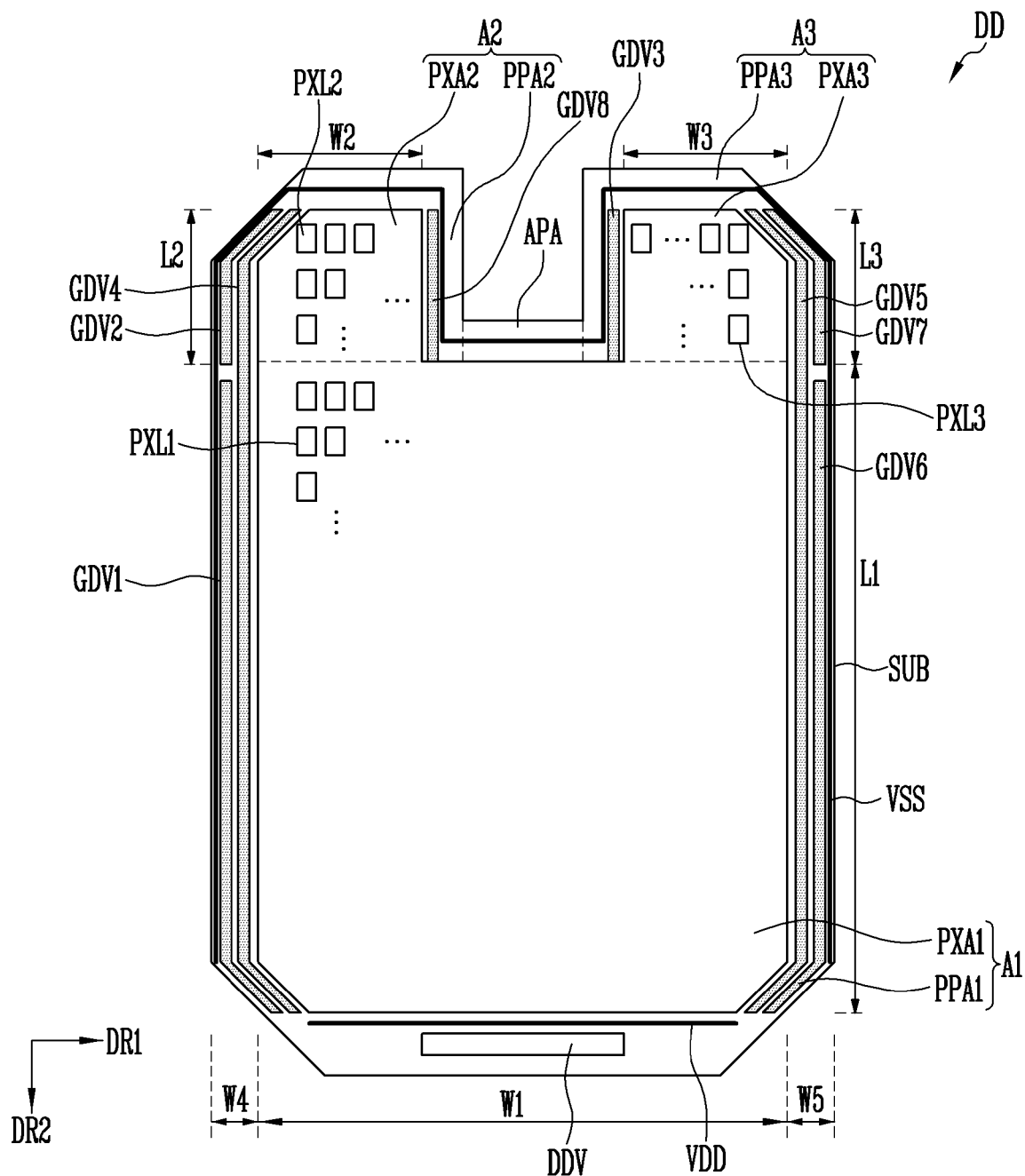
FIG. 2 is a plane view showing an example embodiment of the display device of FIG. 1.

FIG. 2 is a plane view showing an example embodiment of the display device of FIG. 1.

Referring to FIG. 2, the display device DD may include a substrate SUB, pixels PXL1, PXL2, and PXL3 (hereinafter referred to as PXL) provided on the substrate SUB, a driver provided on the substrate SUB and to drive the pixels PXL, and a line unit coupling (e.g., connecting) the pixels PXL and the driver. Also, the display device DD may further include a power supply unit to supply power to the pixels PXL.

The substrate SUB may include a trench portion recessed inward at one side. As shown in FIG. 2, the substrate SUB may include a trench portion recessed inward at an upper side.

The substrate SUB may include areas A1, A2, and A3, and at least two of the areas A1, A2, and A3 may have different areas (e.g., planar areas). The areas A1, A2, and A3 may be divided by the arrangement and length of corresponding lines. The second area A2 and the third area A3 may be disposed to protrude from one side of the first area A1 and may be spaced apart from each other with the trench portion therebetween.

In FIG. 2, the substrate SUB is illustrated as including the first to third areas A1, A2, and A3, but this is an example, and the substrate SUB is not limited thereto. For example, the substrate SUB may have two areas, or four or more areas, and at least two of the areas may have different areas.

Each of the first to third areas A1, A2, and A3 may have various suitable shapes. For example, each of the first to third areas A1, A2, and A3 may have various suitable shapes such as a closed polygon having a side made of a straight line, a circle or an ellipse having a side made of a curved line, and a semicircle or a semi-ellipse having a side made of a straight line and a curved line (e.g., a side made in part of a straight line and in part of a curved line), and the like.

In an example embodiment, each of the first to third areas A1, A2, and A3 may have a substantially quadrangular shape, and may have a shape removing an area adjacent to at least one selected from among vertices of the quadrangular shape. A shape of the area adjacent to at least one selected from among the vertices of the quadrangle shape and removed may have a triangular shape, a quadrangular shape, a diagonal shape inclined on one side of the quadrangular shape, a curved line shape, or a rounded corner shape. For example, one or more of the first to third areas A1, A2, and A3 may have a shape corresponding to a quadrangular shape that has had a portion removed, wherein the removed portion is at a corner of the quadrangular shape, and wherein the shape of the removed portion may be a triangular shape, a quadrangular shape, or a shape having a side with a curved line.

The first to third areas A1, A2, and A3 may include pixel areas PXA1, PXA2, PXA3 (hereinafter, PXA) (or display areas) and peripheral areas PPA1, PPA2, PPA3 (hereinafter, PPA) (or non-display areas), respectively.

The pixel area PXA may be an area where pixels PXL to display an image are provided, and may correspond to the display unit DP of FIG. 1. The first to third pixel areas PXA1, PXA2, and PXA3 may have shapes corresponding to the first to third areas A1, A2, and A3, respectively.

The peripheral areas PPA may be areas in which pixels PXL are not provided, and may be areas in which an image is not displayed. A driver for controlling the pixels PXL, a power supply unit, and a portion of a line (or wire) may be provided on the peripheral areas PPA. The peripheral areas PPA may correspond to the bezel (or dead space) in the final display device DD, and a width of the bezel may be determined depending on a width of the peripheral area PPA.

The first area A1 may have the largest area among the first to third areas A1, A2, and A3. The first area A1 may include a first pixel area PXA1 to display an image and a first peripheral area PPA1 for surrounding at least a portion of the first pixel area PXA1.

The first pixel area PXA1 may be provided as a shape corresponding to the shape of the first area A1. The first pixel area PXA1 may have a first width W1 in a first direction DR1, and may have a first length L1 in a second direction DR2 crossing the first direction DR1.

The first peripheral area PPA1 may be provided at at least one side of the first pixel area PXA1. The first peripheral area PPA1 may surround an edge of the first pixel area PXA1 and may be provided on an area except for the second area A2 and the third area A3. The first peripheral area PPA1 may include a horizontal portion extending in a width direction (e.g., first direction DR1) and a vertical portion extending in a length direction (e.g., second direction DR2). A pair of vertical portions of the first peripheral area PPA1 may be spaced apart from each other in the width direction (or first direction DR1) of the first pixel area PXA1. For example, the pair of vertical portions of the first peripheral area PPA1 may include two portions extending along the second direction DR2 and arranged with each other in the first direction DR1 with the first pixel area PXA1 therebetween.

The second area A2 may be disposed at one side (e.g., upper side) of the first area A1, and may have a smaller area than the first area A1. The second area A2 may have a second pixel area PXA2 where an image is to be displayed and a second peripheral area PPA2 surrounding at least a portion of the second pixel area PXA2.

The second pixel area PXA2 may be provided as (e.g., may have) a shape corresponding to the shape of the second area A2. The second pixel area PXA2 may have a second width W2 smaller than the first width W1 of the first pixel area PXA1. The second pixel area PXA2 may have a second length L2 smaller than the first length L1 of the first pixel area PXA1. In some embodiments, the second width W2 and the second length L2 of the second pixel area PXA2 may be smaller than a width and a length, respectively, of the first area A1. The second pixel area PXA2 may be provided as a shape protruded from the first pixel area PXA1, and may be directly coupled (e.g., connected) to the first pixel area PXA1. For example, in the second pixel area PXA2, an edge portion closest to the first pixel area PXA1 may coincide with an edge of the first pixel area PXA1.

The second peripheral area PPA2 may be provided at at least one side of the second pixel area PXA2. The second peripheral area PPA2 may surround (e.g., partially surround) the second pixel area PXA2, but may not be provided on a portion where the first pixel area PXA1 and the second pixel area PXA2 are coupled (e.g., connected). The second peripheral area PPA2 may also include a horizontal portion extending in the first direction DR1 and a vertical portion extending in the second direction DR2. A pair of vertical portions of the second peripheral area PPA2 may be spaced apart from each other in the first direction DR1 of the second pixel area PXA2. For example, the pair of vertical portions of the second peripheral area PPA2 may include two portions of the second peripheral area PPA2 that extend along the second direction DR2 and are spaced apart from each other in the first direction DR1 with the second pixel area PXA2 therebetween.

The third area A3 may be disposed at one side (e.g., upper side) of the first area A1, may be spaced apart from the second area A2, and may have a smaller area than the first area A1. For example, the third area A3 may be spaced apart from the second area A2 in the first direction DR1. For example, the third area A3 may have the same area as the second area A2. The third area A3 may have a third pixel area PXA3 where an image is to be displayed and a third peripheral area PPA3 surrounding at least a portion of the third pixel area PXA3.

The third pixel area PXA3 may be provided as (e.g., may have) a shape corresponding to the shape of the third area A3. The third pixel area PXA3 may have a third width W3 smaller than the first width W1 of the first pixel area PXA1. The third pixel area PXA3 may have a third length L3 smaller than the first length L1 of the first pixel area PXA1. In some embodiments, the third width W3 and the third length L3 of the third pixel area PXA3 may be smaller than the width and the length, respectively, of the first area A1. The second width W2 and the third width W3 may be the same as each other. Also, the second length L2 and the third length L3 may be the same as each other.

The third pixel area PXA3 may be provided as a shape protruded from the first area A1, and may be directly coupled (e.g., connected) to the first area A1. For example, in the third pixel area PXA3, an edge portion closest to the first pixel area PXA1 may coincide with an edge of the first pixel area PXA1.

The third peripheral area PPA3 may be provided at at least one side of the third pixel area PXA3. The third peripheral area PPA3 may surround (e.g., partially surround) the third pixel area PXA3, but may not be provided on a portion where the first pixel area PXA1 and the third pixel area PXA3 are coupled (e.g., connected). The third peripheral area PPA3 may also include a horizontal portion extending in the width direction and a vertical portion extending in the length direction. A pair of vertical portions of the third peripheral area PPA3 may also be spaced apart from each other in the first direction DR1. For example, the pair of vertical portions of the third peripheral area PPA3 may include two portions of the third peripheral area PPA3 that extend along the second direction DR2 and are spaced apart from each other in the first direction DR1 with the third pixel area PXA3 therebetween.

In an example embodiment, with respect to a central line of the first area A1 (e.g., an imaginary line extending along the second direction DR2 and extending through a center of the first area A1 or first pixel area PXA1), the third area A3 may have a shape that is line-symmetric (e.g., reflectively symmetrical) with the second area A2. In this case, an arrangement relationship of each component provided on the third area A3 may be substantially the same as or similar to that of the second area A2 except for some lines.

Accordingly, the substrate SUB may have a shape in which the second area A2 and the third area A3 are protruded from the first area A1 in the second direction DR2. In addition, because the second area A2 and the third area A3 are spaced apart from each other, the substrate SUB may have a recessed shape between the second area A2 and the third area A3. For example, the substrate SUB may have a notch between the second area A2 and the third area A3.

In an example embodiment, the vertical portions of the first peripheral area PPA1 may be respectively coupled (e.g., connected) to some of the vertical portions of the second peripheral area PPA2 and the third peripheral area PPA3. For example, a left vertical portion of the first peripheral area PPA1 and a left vertical portion of the second peripheral area PPA2 may be coupled (e.g., connected) to each other. A right vertical portion of the first peripheral area PPA1 and a right vertical portion of the third peripheral area PPA3 may be coupled (e.g., connected) to each other. In addition, a width W4 of the left vertical portion of the first peripheral area PPA1 and a width W4 of the left vertical portion of the second peripheral area PPA2 may be the same as each other. A width W5 of the right vertical portion of the first peripheral area PPA1 and a width W5 of the right vertical portion of the third peripheral area PPA3 may be the same as each other.

In some cases, the width W4 of the left vertical portions of the first peripheral area PPA1 and the second peripheral area PPA2 may be different form the width W5 of the right vertical portions of the first peripheral area PPA1 and the third peripheral area PPA3.

In an example embodiment, the second peripheral area PPA2 and the third peripheral area PPA3 may be coupled (e.g., connected) through an added peripheral area APA. For example, the added peripheral area APA may couple (e.g., connect) the right vertical portion of the second peripheral area PPA2 and the left vertical portion of the third peripheral area PPA3. For example, the added peripheral area APA may be provided at the side (e.g., upper side) of the first pixel area PXA1 between the second area A2 and the third area A3.

The pixels PXL may be provided on the pixel area PXA, for example, on the first to third pixel areas PXA1, PXA2, and PXA3 on the substrate SUB. Each pixel PXL may include a light emitting element which is to emit color light.

Each of the pixels PXL may emit light of one of red, green and blue colors, but is not limited thereto. For example, each of the pixels PXL may emit light of colors such as cyan, magenta, yellow, and white.

The pixels PXL may include first pixels PXL1 disposed on the first pixel area PXA1, second pixels PXL2 disposed on the second pixel area PXA2, and third pixels PXL3 disposed on the third pixel area PXA3. In an example embodiment, the first to third pixels PXL1, PXL2, and PXL3 may be arranged in a matrix form along a row extending in the first direction DR1 and a column extending in the second direction DR2. For example, the first to third pixels PXL1, PXL2, and PXL3 may be arranged in a matrix of pixels, and each pixel of the first to third pixels PXL1, PXL2, and PXL3 may be arranged along a corresponding row extending in the first direction DR1 and along a corresponding column extending in the second direction DR2. However, the arrangement form of the first to third pixels PXL1, PXL2, and PXL3 is not particularly limited, and the first to third pixels PXL1, PXL2, and PXL3 may be arranged in various suitable forms.

The driver may provide a signal to the pixels PXL through a line unit, thereby controlling the driving of the pixel PXL. The line unit may include the data lines DL1, DL2, and DLm and the scan lines GWL1, GCL1, GBL1, GIL1, EML1, GWLn, GCLn, GBLn, GILn, and EMLn described with reference to FIG. 1. For convenience of description, the line unit is omitted in FIG. 2.

As described with reference to FIG. 1, the driver may include the data driver DDV, the first scan driver SDV1, and the second scan driver SDV2.

The first scan driver SDV1 may include a first gate driver GDV1, a second gate driver GDV2, a third gate driver GDV3, and a fourth gate driver GDV4.

Each of the first gate driver GDV1, the second gate driver GDV2, and the third gate driver GDV3 may include a compensation scan driver (or compensation stages) and a bypass scan driver (or, bypass stages) described with reference to FIG. 1. The fourth gate driver GDV4 may include a first write scan driver (or write stages) described with reference to FIG. 1. An example configuration of each of the first gate driver GDV1 to the fourth gate driver GDV4 will be described later with reference to FIG. 6.

The first gate driver GDV1 is disposed in a vertical portion of the first peripheral area PPA1 and may be coupled (e.g., connected) to the first pixels PXL1. For example, the first gate driver GDV1 may be disposed on the left vertical portion of the first peripheral area PPA1, which is disposed at the left side of the first pixel area PXA1. The first gate driver GDV1 may extend in the second direction DR2.

The second gate driver GDV2 may be disposed on the vertical portion of the second peripheral area PPA2, and may be coupled (e.g., connected) to the second pixels PXL2. For example, the second gate driver GDV2 may be disposed on the left vertical portion of the second peripheral area PPA2, which is disposed at the left side of the second pixel area PXA2. The second gate driver GDV2 may extend in the second direction DR2.

The third gate driver GDV3 may be disposed on the vertical portion of the third peripheral area PPA3, and may be coupled (e.g., connected) to the third pixels PXL3. For example, the third gate driver GDV3 may be disposed on the left vertical portion of the third peripheral area PPA3, which is disposed at the left side of the third pixel area PXA3. For example, the third gate driver GDV3 may be disposed on the third peripheral area PPA3 between the second pixel area PXA2 and the third pixel area PXA3. The third gate driver GDV3 may extend in the second direction DR2.

The fourth gate driver GDV4 may be disposed on the vertical portion of the first peripheral area PPA1 and the vertical portion of the second peripheral area PPA2, and may be coupled (e.g., connected) to the first to third pixels PXL1, PXL2, and PXL3. For example, the fourth gate driver GDV4 may be coupled (e.g., connected) to the third pixels PXL3 through connection lines provided on the added peripheral area APA between the second pixel area PXA2 and the third pixel area PXA3. A connection structure between the fourth gate driver GDV4 and the third pixels PXL3 will be described later with reference to FIG. 6.

For example, the fourth gate driver GDV4 may be disposed on the left vertical portion of the first peripheral area PPA1, which is disposed at the left side of the first pixel area PXA1. For example, the fourth gate driver GDV4 may be disposed on the left vertical portion of the second peripheral area PPA2, which is disposed at the left side of the second pixel area PXA2. The fourth gate driver GDV4 may extend in the second direction DR2.

The second scan driver SDV2 may include a fifth gate driver GDV5, a sixth gate driver GDV6, a seventh gate driver GDV7, and an eighth gate driver GDV8.

The fifth gate driver GDV5 may include a second write scan driver (or write stages) described with reference to FIG. 1. Each of the sixth gate driver GDV6, the seventh gate driver GDV7, and the eighth gate driver GDV8 may include an initialization scan driver (or initialization stages) and a light emission scan driver (or light emission stages) described with reference to FIG. 1. An example configuration of each of the fifth gate driver GDV5 to the eighth gate driver GDV8 will be described later with reference to FIG. 9.

The fifth gate driver GDV5 may be disposed on the vertical portion of the first peripheral area PPA1 and the vertical portion of the third peripheral area PPA3, and may be coupled (e.g., connected) to the first to third pixels PXL1, PXL2, and PXL3. For example, the fifth gate driver GDV5 may be coupled (e.g., connected) to the second pixels PXL2 through connection lines provided on the added peripheral area APA between the second pixel area PXA2 and the third pixel area PXA3. For example, the fifth gate driver GDV5 may be disposed on the right vertical portion of the first peripheral area PPA1, which is disposed at the right side of the first pixel area PXA1. For example, the fifth gate driver GDV5 may be disposed on the right vertical portion of the third peripheral area PPA3, which is disposed at the right side of the third pixel area PXA3. The fifth gate driver GDV5 may extend in the second direction DR2.

The sixth gate driver GDV6 may be disposed on the vertical portion of the first peripheral area PPA1, and may be coupled (e.g., connected) to the first pixels PXL1. For example, the sixth gate driver GDV6 may be disposed on the right vertical portion of the first peripheral area PPA1, which is disposed at the right side of the first pixel area PXA1. The sixth gate driver GDV6 may extend in the second direction DR2.

The seventh gate driver GDV7 may be disposed on a vertical portion of the third peripheral area PPA3 and may be coupled (e.g., connected) to the third pixels PXL3. For example, the seventh gate driver GDV7 may be disposed on the right vertical portion of the third peripheral area PPA3, which is disposed at the right side of the third pixel area PXA3. The seventh gate driver GDV7 may extend in the second direction DR2.

The eighth gate driver GDV8 is disposed on the vertical portion of the second peripheral area PPA2 and may be coupled (e.g., connected) to the second pixels PXL2. For example, the eighth gate driver GDV8 may be disposed on the right vertical portion of the second peripheral area PPA2, which is disposed at the right side of the second pixel area PXA2. For example, the eighth gate driver GDV8 may be disposed on the second peripheral area PPA2 between the second pixel area PXA2 and the third pixel area PXA3. The eighth gate driver GDV8 may extend in the second direction DR2.

In an example embodiment, each of the first scan driver SDV1 and the second scan driver SDV2 may be directly mounted on the substrate SUB. When the first scan driver SDV1 and the second scan driver SDV2 are directly mounted on the substrate SUB, they may be formed together in the process of forming the pixels PXL. However, a position or method of providing is not limited thereto. For example, the first scan driver SDV1 and the second scan driver SDV2 may be formed on a plurality of separate chips and provided in the form of a chip-on-glass on the substrate SUB, or may be mounted on a printed circuit board and coupled (e.g., connected) to the substrate SUB through a connection member.

The data driver DDV may be disposed on the first peripheral area PPA1. The data driver DDV may be disposed on the horizontal portion of the first peripheral area PPA1. The data driver DDV may extend in the width direction (e.g., first direction DR1) of the first peripheral area PPA1.

The timing controller TC (refer to FIG. 1) may be coupled (e.g., connected) to the first scan driver SDV1, the second scan driver SDV2, and the data driver DDV through lines (or wire) in various suitable ways, and a position thereof is not particularly limited. For example, the timing controller TC may be mounted on a printed circuit board and may be coupled (e.g., connected) to the first scan driver SDV1, the second scan driver SDV2, and the data driver DDV through a flexible printed circuit board, and the printed circuit board may be disposed at various suitable positions such as one side or a backside of the substrate SUB, and the like.

The power supply unit may include at least one power supply line VDD and VSS. For example, the power supply unit may include a first power supply line VDD and a second power supply line VSS. The first power supply line VDD and the second power supply line VSS may supply power to the first pixel PXL1, the second pixel PXL2, and the third pixel PXL3.

One of the first power supply line VDD and the second power supply line VSS, for example, the first power supply line VDD may be disposed to correspond to one side of the first pixel area PXA1. For example, the first power supply line VDD may be disposed on an area in which the data driver DDV of the first peripheral area PPA1 is disposed. Also, the first power supply line VDD may extend in the width direction of the first pixel area PXA1.

The other of the first power supply line VDD and the second power supply line VSS, for example, the second power supply line VSS may be disposed to surround (e.g., partially surround) the first pixel area PXA1 (except for an area of the first pixel area PXA1 where the data driver DDV on the first peripheral area PPA1 is disposed), the second pixel area PXA2, and the third pixel area PXA3. For example, the second power supply line VSS may have a shape extending along the left vertical portion of the first peripheral area PPA1, the second peripheral area PPA2, the third peripheral area PPA3, the added peripheral area APA, and the right vertical portion of the first peripheral area PPA1.

In FIG. 2, the example embodiment in which the first power supply line VDD is disposed on the peripheral area corresponding to one side of the first pixel area PXA1 of the first peripheral areas PPA1, and the second power supply line VSS is disposed on the remaining peripheral areas, is described, but is not limited thereto. For example, the first power supply line VDD and the second power supply line VSS may be disposed to surround the first pixel area PXA1, the second pixel area PXA2, and the third pixel area PXA3.

A voltage applied to the first power supply line VDD may be higher than a voltage applied to the second power supply line VSS.

As described with reference to FIG. 2, the third gate driver GDV3 (i.e., third gate driver GDV3 including the compensation stages and the bypass stages, and coupled (e.g., connected) to the third pixels PXL3) may be disposed on the third peripheral area PPA3 between the second pixel area PXA2 and the third pixel area PXA3. Also, the eighth gate driver GDV8 (i.e., eighth gate driver GDV8 including the initialization stages and the light emission stages, and coupled (e.g., connected) to the second pixels PXL2) may be disposed on the second peripheral area PPA2 between the second pixel area PXA2 and the third pixel area PXA3.

Accordingly, lines (e.g., some of the compensation scan lines GCL1 and GCLn and a portion passing through the added peripheral area APA of the bypass scan lines GBL1 and GBLn, described with reference to FIG. 1) for transferring the compensation scan signals and the bypass scan signals from the second pixel area PXA2 to the third pixel area PXA3 via the added peripheral area APA, may be removed. Also, lines (e.g., some of the initialization scan lines GIL1 and GILn and a portion passing through the added peripheral area APA of the light emission scan lines EML1 and EMLn, described with reference to FIG. 1) for transferring the initialization scan signals and the light emission scan signals from the third pixel area PXA3 to the second pixel area PXA2 via the added peripheral area APA, may be removed.

For example, the number of lines extending in the first direction DR1 between the second pixel area PXA2 and the third pixel area PXA3 may be reduced. Accordingly, in the added peripheral area APA having a width (or length) defined in the second direction DR2, a space in which other components may be disposed may be secured in response to the reduced number of lines. In this space, a load matching capacitor may be disposed for compensating for a load of some (e.g., write scan lines coupled (e.g., connected) to the first pixels PXL1 and the second pixels PXL2 via the added peripheral area APA) of the write scan lines GWL1 and GWLn described with reference to FIG. 1, and the load matching capacitor may have a larger capacitance. Therefore, a load difference between the write scan lines GWL1 and GWLn can be more sufficiently compensated.

Furthermore, the lines extending in the first direction DR1 between the second pixel area PXA2 and the third pixel area PXA3 cannot overlap each other and can be disposed to be spaced apart from each other with a sufficient distance (i.e., distance in the second direction DR2), thereby reducing the influence of interference between adjacent lines and the possibility of occurrence of defects (e.g., short). For example, in some embodiments, the lines extending in the first direction DR1 between the second pixel area PXA2 and the third pixel area PXA3 do not overlap each other in a plan view and are sufficiently spaced apart from each other (e.g., spaced apart from each other in the second direction DR2) in the plan view to reduce the influence of interference between the lines, and also to reduce the occurrence of defects.

Meanwhile, in FIG. 2, the second gate driver GDV2 is described as being separated (e.g., spaced apart in a plan view, for example, along the second direction DR2) from the first gate driver GDV1, and the seventh gate driver GDV7 is described as being separated (e.g., spaced apart in a plan view, for example, along the second direction DR2) from the sixth gate driver GDV6, but the present disclosure is not limited thereto. For example, the second gate driver GDV2 and the first gate driver GDV1 may be implemented as one gate driver or an integrated circuit, and/or the seventh gate driver GDV7 and the sixth gate driver GDV6 may also be implemented as one gate driver or an integrated circuit.

Figure 3:
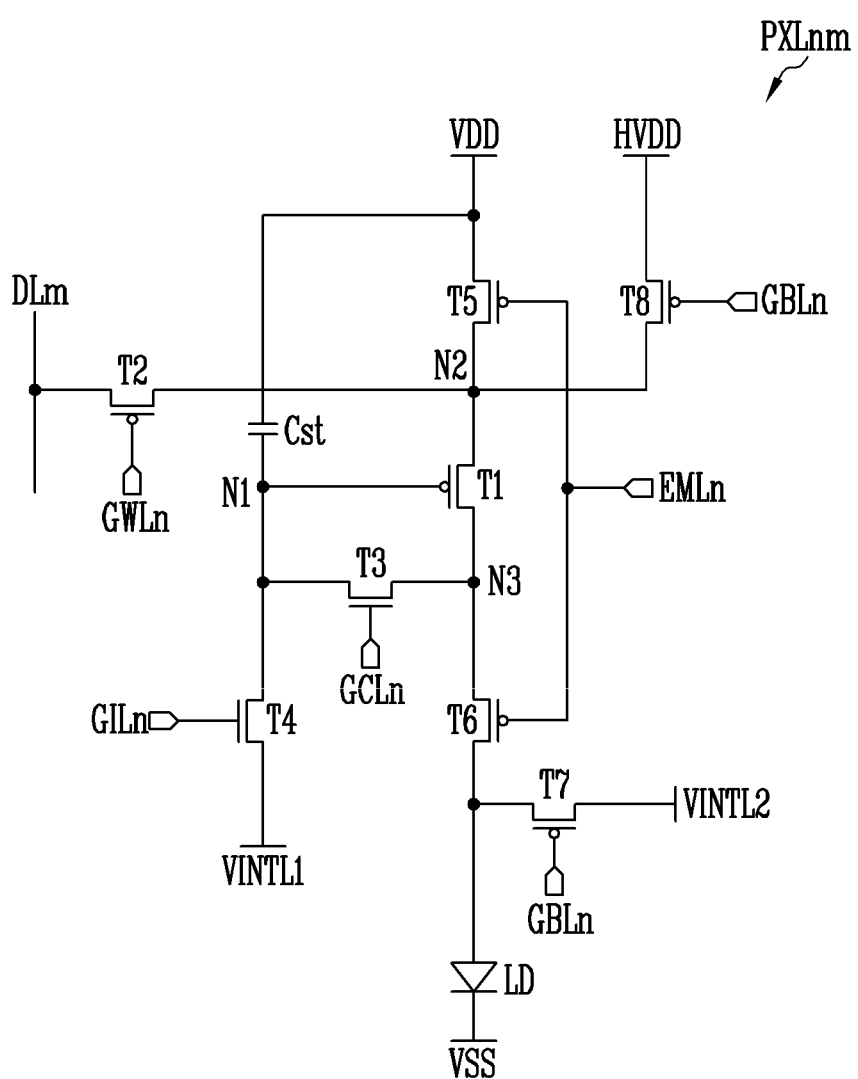
FIG. 3 is a circuit diagram showing an example embodiment of a pixel included in a display device of FIG. 1.

FIG. 3 is a circuit diagram showing an example embodiment of a pixel included in a display device of FIG. 1. Because the pixels PXLnm shown in FIG. 1 (and first pixels PXL1, second pixels PXL2, and third pixels PXL3 shown in FIG. 2) may be substantially the same or similar, the pixel PXLnm will be described on behalf of the pixels.

Referring to FIG. 3, the pixel PXLnm may include first to eighth transistors T1 to T8, a storage capacitor Cst, and a light emitting diode LD (or light emitting element).

A first electrode of the first transistor T1 may be coupled (e.g., connected) to a second node N2, a second electrode of the first transistor T1 may be coupled (e.g., connected) to a third node N3, and a gate electrode of the first transistor T1 may be coupled (e.g., connected) to a first node N1. The first transistor T1 may be referred to as a driving transistor.

A first electrode of the second transistor T2 may be coupled (e.g., connected) to the data line DLm, a second electrode of the second transistor T2 may be coupled (e.g., connected) to the first electrode (and/or second node N2) of the first transistor T1, and a gate electrode of the second transistor T2 may be coupled (e.g., connected) to the write scan line GWLn. In some embodiments, the second electrode of the second transistor T2 may be coupled (e.g., connected) to the second node N2 and to the first electrode of the first transistor T1 (e.g., the second electrode of the second transistor T2 may be coupled (e.g., connected) to the first electrode of the first transistor T1 through the second node N2). The second transistor T2 may be referred to as a switching transistor.

A first electrode of the third transistor T3 may be coupled (e.g., connected) to the gate electrode (and/or first node N1) of the first transistor T1, a second electrode of the third transistor T3 may be coupled (e.g., connected) to the second electrode (and/or third node N3) of the first transistor T1, and a gate electrode of the third transistor T3 may be coupled (e.g., connected) to the compensation scan line GCLn. The third transistor T3 may be referred to as a compensation transistor.

A first electrode of the fourth transistor T4 may be coupled (e.g., connected) to the gate electrode (and/or first node N1) of the first transistor T1, a second electrode of the fourth transistor T4 may be coupled (e.g., connected) to a first initialization line VINTL1, and a gate electrode of the fourth transistor T4 may be coupled (e.g., connected) to the initialization scan line GILn. The fourth transistor T4 may be referred to as an initialization transistor.

A first electrode of the fifth transistor T5 may be coupled (e.g., connected) to the first power supply line VDD, a second electrode of the fifth transistor T5 may be coupled (e.g., connected) to the first electrode (and/or second node N2) of the first transistor T1, and a gate electrode of the fifth transistor T5 may be coupled (e.g., connected) to the light emission scan line EMLn. The fifth transistor T5 may be referred to as a first light emission transistor.

A first electrode of the sixth transistor T6 may be coupled (e.g., connected) to the second electrode (and/or third node N3) of the first transistor T1, a second electrode of the sixth transistor T6 may be coupled (e.g., connected) to the anode (or anode electrode) of the light emitting diode LD, and a gate electrode of the sixth transistor T6 may be coupled (e.g., connected) to the light emission scan line EMLn. The sixth transistor T6 may be referred to as a second light emission transistor.

A first electrode of the seventh transistor T7 may be coupled (e.g., connected) to the anode of the light emitting diode LD, a second electrode of the seventh transistor T7 may be coupled (e.g., connected) to a second initialization line VINTL2, and a gate electrode of the seventh transistor T7 may be coupled (e.g., connected) to the bypass scan line GBLn. The seventh transistor T7 may be referred to as a second bypass transistor.

A first electrode of the eighth transistor T8 may be coupled (e.g., connected) to a third power supply line HVDD, a second electrode of the eighth transistor T8 may be coupled (e.g., connected) to the first electrode (and/or second node N2) of the first transistor T1, and a gate electrode of the eighth transistor T8 may be coupled (e.g., connected) to the bypass scan line GBLn. The eighth transistor T8 may be referred to as a first bypass transistor.

The storage capacitor Cst may be formed and/or coupled (e.g., connected) between the first power supply line VDD and the gate electrode (and/or first node N1) of the first transistor T1. For example, a first electrode of the storage capacitor Cst may be coupled (e.g., connected) to the first power supply line VDD, and a second electrode of the storage capacitor Cst may be coupled (e.g., connected) to the gate electrode of the first transistor T1.

The anode of the light emitting diode LD may be coupled (e.g., connected) to the second electrode of the sixth transistor T6, and the cathode (or cathode electrode) of the light emitting diode LD may be coupled (e.g., connected) to the second power supply line VSS. The light emitting diode LD may be composed of an organic light emitting diode or an inorganic light emitting diode such as a micro light emitting diode (LED), or a quantum dot light emitting diode. In addition, the light emitting diode LD may be a light emitting element made of an organic material and an inorganic material in combination (e.g., a composite material including organic and inorganic materials). In FIG. 3, the pixel PXLnm is shown to include a single light emitting diode LD, but it not limited thereto. For example, in another example embodiment, the pixel PXLnm may include a plurality of light emitting diodes, and the plurality of light emitting diodes may be coupled (e.g., connected) to each other in series, in parallel, or in series and parallel.

Voltages applied to the first power supply line VDD and the third power supply line HVDD may be set larger than voltages applied to the first initialization line VINTL1, the second initialization line VINTL2, and the second power supply line VSS. The voltage applied to the third power supply line HVDD may be set larger than the voltage applied to the first power supply line VDD.

The first, second, fifth, sixth, seventh, and eighth transistors T1, T2, T5, T6, T7, and T8 may be P-type transistors (e.g., P-based transistors). Channels of the first, second, fifth, sixth, seventh, and eighth transistors T1, T2, T5, T6, T7, and T8 may be made of polysilicon. A polysilicon transistor may be a low temperature poly silicon (LTPS) transistor. The polysilicon transistor has a high electron mobility and a fast driving characteristic.

The third and fourth transistors T3 and T4 may be N-type transistors (e.g., N-based transistors). In this case, channels of the third and fourth transistors T3 and T4 may be made of an oxide semiconductor. An oxide semiconductor transistor may have a lower electron mobility than polysilicon transistor. Therefore, an amount of a leakage current generated in a turn-off state of the oxide semiconductor transistors is smaller than that of the polysilicon transistors.

Figure 4:
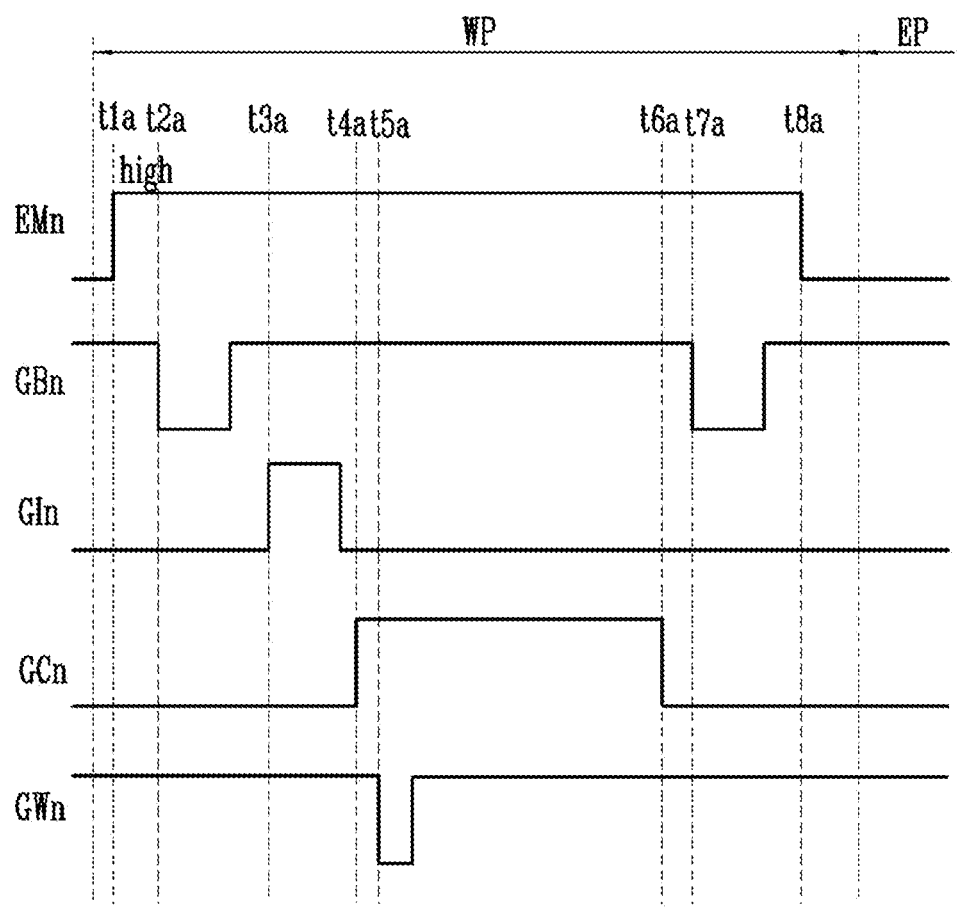
FIG. 4 is a waveform diagram describing an operation of the pixel of FIG. 3.

FIG. 4 is a waveform diagram describing an operation of the pixel of FIG. 3.

Referring to FIGS. 1, 3, and 4, the display device DD of FIG. 1 may display one image frame in a frame period. The image frame may sequentially include a data write period WP and a light emitting period EP.

At a first time point t1a, the light emission scan signal EMn of a turn-off level (or logic high level) may be supplied to the light emission scan line EMLn. In this case, the fifth and sixth transistors T5 and T6 may be turned off, and a driving current flowing from the first power supply line VDD to the second power supply line VSS may be cut off.

At a second time point t2a, the bypass scan signal GBn of a turn-on level (or logic low level) may be supplied to the bypass scan line GBLn. In this case, the seventh and eighth transistors T7 and T8 may be turned on. An initialization voltage of the second initialization line VINTL2 may be applied to the anode of the light emitting diode LD through the turned-on seventh transistor T7, and a voltage of the anode of the light emitting diode LD may be initialized. In addition, a power voltage of the third power supply line HVDD may be applied to the first electrode (and/or second node N2) of the first transistor T1 through the turned-on eighth transistor T8. The first transistor T1 may be on-biased due to a voltage difference between the gate electrode and the first electrode of the first transistor T1. Therefore, a hysteresis phenomenon depending on a grayscale (or data voltage) of the previous frame period can be prevented or reduced. For example, because the power voltage of the third power supply line HVDD, and not a data voltage of the previous horizontal period, is utilized as the on-biased voltage of the first transistor T1, the first transistor T1 can be on-biased in all frame periods.

At a third time point t3a, the initialization scan signal GIn of a turn-on level (or logic high level) may be supplied to the initialization scan line GILn. In this case, the fourth transistor T4 may be turned on, the initialization voltage of the first initialization line VINTL1 may be applied to the gate electrode (and/or first node N1) of the first transistor T1, and the voltage of the gate electrode of the first transistor T1 may be initialized.

At a fourth time point t4a, the compensation scan signal GCn of a turn-on level (or logic high level) may be supplied to the compensation scan line GCLn. Therefore, the third transistor T3 may be turned on, and the first transistor T1 may be coupled (e.g., connected) in a diode form.

At a fifth time point t5a, the write scan signal GWn of a turn-on level may be supplied to the write scan line GWLn. In this case, the second transistor T2 may be turned on. The data voltage corresponding to the pixel PXLnm may be applied to the data line DLm. The data voltage may be applied to the gate electrode (and/or first node N1) of the first transistor T1 by passing through the second transistor T2, the first transistor T1, and the third transistor T3 sequentially. Here, the voltage applied to the gate electrode of the first transistor T1 may correspond to a difference between the data voltage and a threshold voltage of the first transistor T1. A current amount corresponding to the difference between the data voltage and the threshold voltage of the first transistor T1 may be accumulated in the storage capacitor Cst.

Thereafter, even if the write scan signal GWn of a turn-off level (or logic high level) is supplied, the first electrode of the first transistor T1 may maintain the data voltage by parasitic capacitance. Therefore, the threshold voltage of the first transistor T1 may be compensated from the fifth time point t5a to a sixth time point t6a. At the sixth time point t6a, the compensation scan signal GCn at a turn-off level (or logic low level) may be supplied to the compensation scan line GCLn.

At a seventh time point t7a, the bypass scan signal GBn of a turn-on level (or logic low level) may be supplied to the bypass scan line GBLn. In this case, the seventh and eighth transistors T7 and T8 may be turned on. The initialization voltage of the second initialization line VINTL2 may be applied to the anode of the light emitting diode LD through the turned-on seventh transistor T7, and the voltage of the anode of the light emitting diode LD may be initialized again. In addition, the power voltage of the third power supply line HVDD may be applied to the first electrode of the first transistor T1 through the turned-on eighth transistor T8, and the first transistor T1 may be on-biased by a voltage difference between the gate electrode and the first electrode of the first transistor T1. According to an example embodiment, the bypass scan signal GBn of a turn-on level may be supplied only at one of the second time point t2a and the seventh time point t7a.

At the eighth time point t8a, the light emission scan signal EMn of a turn-on level (or logic low level) may be supplied to the light emission scan line EMLn. In this case, the fifth and sixth transistors T5 and T6 may be turned on, a driving current may flow from the first power supply line VDD to the second power supply line VSS, and the light emitting diode LD may emit light with luminance corresponding to the driving current during the light emitting period EP after the eighth time point t8a.

Figure 5:
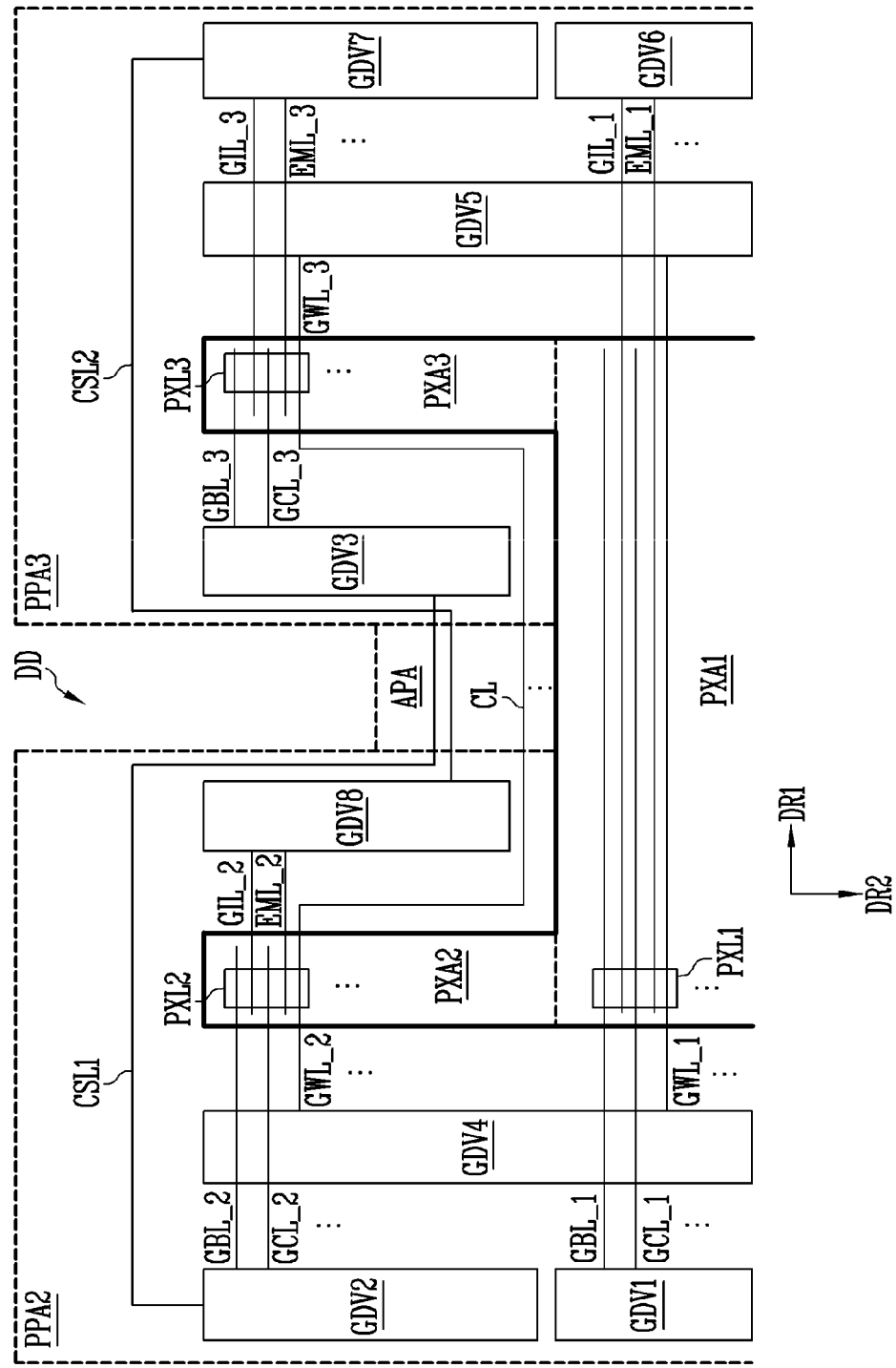
FIG. 5 is a drawing showing an example embodiment of the display device of FIG. 2.

FIG. 5 is a drawing showing an example embodiment of the display device of FIG. 2.

Referring to FIGS. 2 and 5, a bypass scan line GBL_1 (or first bypass scan line), a compensation scan line GCL_1 (or first compensation scan line), an initialization scan line GIL_1 (or first initialization scan line), the light emission scan line EML_1 (or first light emission scan line), and a write scan line GWL_1 (or first write scan line), may be provided on the first pixel area PXA1. Each of the bypass scan line GBL_1, the compensation scan line GCL_1, the initialization scan line GIL_1, the light emission scan line EML_1, and the write scan line GWL_1 in the first pixel area PXA1 may extend in the first direction DR1.

The first gate driver GDV1 may be coupled (e.g., connected) to the first pixel PXL1 through the bypass scan line GBL_1 and the compensation scan line GCL_1 in the first pixel area PXA1. The sixth gate driver GDV6 may be coupled (e.g., connected) to the first pixel PXL1 through the initialization scan line GIL_1 and the light emission scan line EML_1 in the first pixel area PXA1. The fourth gate driver GDV4 and the fifth gate driver GDV5 may be coupled (e.g., connected) to the write scan line GWL_1 in the first pixel area PXA1, and may be coupled (e.g., connected) to the first pixel PXL1 through the write scan line GWL_1 in the first pixel area PXA1.

A bypass scan line GBL_2 (or second bypass scan line), a compensation scan line GCL_2 (or second compensation scan line), an initialization scan line GIL_2 (or second initialization scan line), a light emission scan line EML_2 (or second light emission scan line), and a write scan line GWL_2 (or second write scan line), may be provided on the second pixel area PXA2. Each of the bypass scan line GBL_2, the compensation scan line GCL_2, the initialization scan line GIL_2, the light emission scan line EML_2, and the write scan line GWL_2 in the second pixel area PXA2 may extend in the first direction DR1.

The second gate driver GDV2 may be coupled (e.g., connected) to the bypass scan line GBL_2 and the compensation scan line GCL_2 in the second pixel area PXA2. Also, the second gate driver GDV2 may be coupled (e.g., connected) to the second pixel PXL2 through the bypass scan line GBL_2 and the compensation scan line GCL_2 in the second pixel area PXA2. The eighth gate driver GDV8 may be coupled (e.g., connected) to the initialization scan line GIL_2 and the light emission scan line EML_2 in the second pixel area PXA2. Also, the eighth gate driver GDV8 may be coupled (e.g., connected) to the second pixel PXL2 through the initialization scan line GIL_2 and the light emission scan line EML_2 in the second pixel area PXA2. The fourth gate driver GDV4 and the fifth gate driver GDV5 may be coupled (e.g., connected) to the write scan line GWL_2 in the second pixel area PXA2. Also, the fourth gate driver GDV4 and the fifth gate driver GDV5 may be coupled (e.g., connected) to the second pixel PXL2 through the write scan line GWL_2 in the second pixel area PXA2.

A bypass scan line GBL_3 (or third bypass scan line), a compensation scan line GCL_3 (or third compensation scan line), an initialization scan line GIL_3 (or third initialization scan line), a light emission scan line EML_3 (or third light emission scan line), and a write scan line GWL_3 (or third write scan line), may be provided on the third pixel area PXA3. Each of the bypass scan line GBL_3, the compensation scan line GCL_3, the initialization scan line GIL_3, the light emission scan line EML_3, and the write scan line GWL_3 in the third pixel area PXA3 may extend in the first direction DR1. In addition, the bypass scan line GBL_3, the compensation scan line GCL_3, the initialization scan line GIL_3, and the light emission scan line EML_3 in the third pixel area PXA3 may be spaced apart from or separated from the bypass scan line GBL_2, the compensation scan line GCL_2, the initialization scan line GIL_2, and the light emission scan line EML_2 in the second pixel area PXA2 with the added peripheral area APA therebetween. For example, the bypass scan line GBL_2, the compensation scan line GCL_2, the initialization scan line GIL_2, and the light emission scan line EML_2 may only be in the second pixel area PXA2, and the bypass scan line GBL_3, the compensation scan line GCL_3, the initialization scan line GIL_3, and the light emission scan line EML_3 may only be in the third pixel area PXA3. The write scan line GWL_3 in the third pixel area PXA3 may be coupled (e.g., connected) to the write scan line GWL_2 in the second pixel area PXA2 through a connection line CL provided on the added peripheral area APA. The write scan line GWL_3 in the third pixel area PXA3 may be integrally formed with the connection line CL and the write scan line GWL_2 in the second pixel area PXA2. For example, in some embodiments, the write scan line GWL_3, the connection line CL, and the write scan line GWL_2 may be a single integrated line (e.g., wire).

The third gate driver GDV3 may be coupled (e.g., connected) to the bypass scan line GBL_3 and the compensation scan line GCL_3 in the third pixel area PXA3, and may be coupled (e.g., connected) to the third pixel PXL3 through the bypass scan line GBL_3 and the compensation scan line GCL_3 in the third pixel area PXA3. The seventh gate driver GDV7 may be coupled (e.g., connected) to the initialization scan line GIL_3 and the light emission scan line EML_3 in the third pixel area PXA3, and may be coupled (e.g., connected) to the third pixel PXL3 through the initialization scan line GIL_3 and the light emission scan line EML_3 in the third pixel area PXA3. The fourth gate driver GDV4 and the fifth gate driver GDV5 may be coupled (e.g., connected) to the write scan line GWL_3 in the third pixel area PXA3, and may be coupled (e.g., connected) to the third pixel PXL3 through the write scan line GWL_3 in the third pixel area PXA3.

The second gate driver GDV2 and the third gate driver GDV3 may be coupled (e.g., connected) to a first control signal line CSL1. The first control signal line CSL1 may extend from the second peripheral area PPA2 to the third peripheral area PPA3 via the added peripheral area APA, and clock signals and a start signal (e.g., bypass start signal, compensation start signal) may be applied to the first control signal line CSL1. In this case, the second gate driver GDV2 and the third gate driver GDV3 may generate a bypass scan signal and a compensation scan signal having the same waveform and the same phase utilizing the same clock signals and the same start signal, respectively.

Similarly, the seventh gate driver GDV7 and the eighth gate driver GDV8 may be coupled (e.g., connected) to a second control signal line CSL2. The second control signal line CSL2 may extend from the third peripheral area PPA3 to the second peripheral area PPA2 via the added peripheral area APA, and clock signals and a start signal (e.g., initialization start signal, light emission stop signal) may be applied to the second control signal line CSL2. In this case, the seventh gate driver GDV7 and the eighth gate driver GDV8 may generate an initialization scan signal and a light emission scan signal having the same waveform and the same phase utilizing the same clock signals and the same start signal, respectively.

Figure 6:
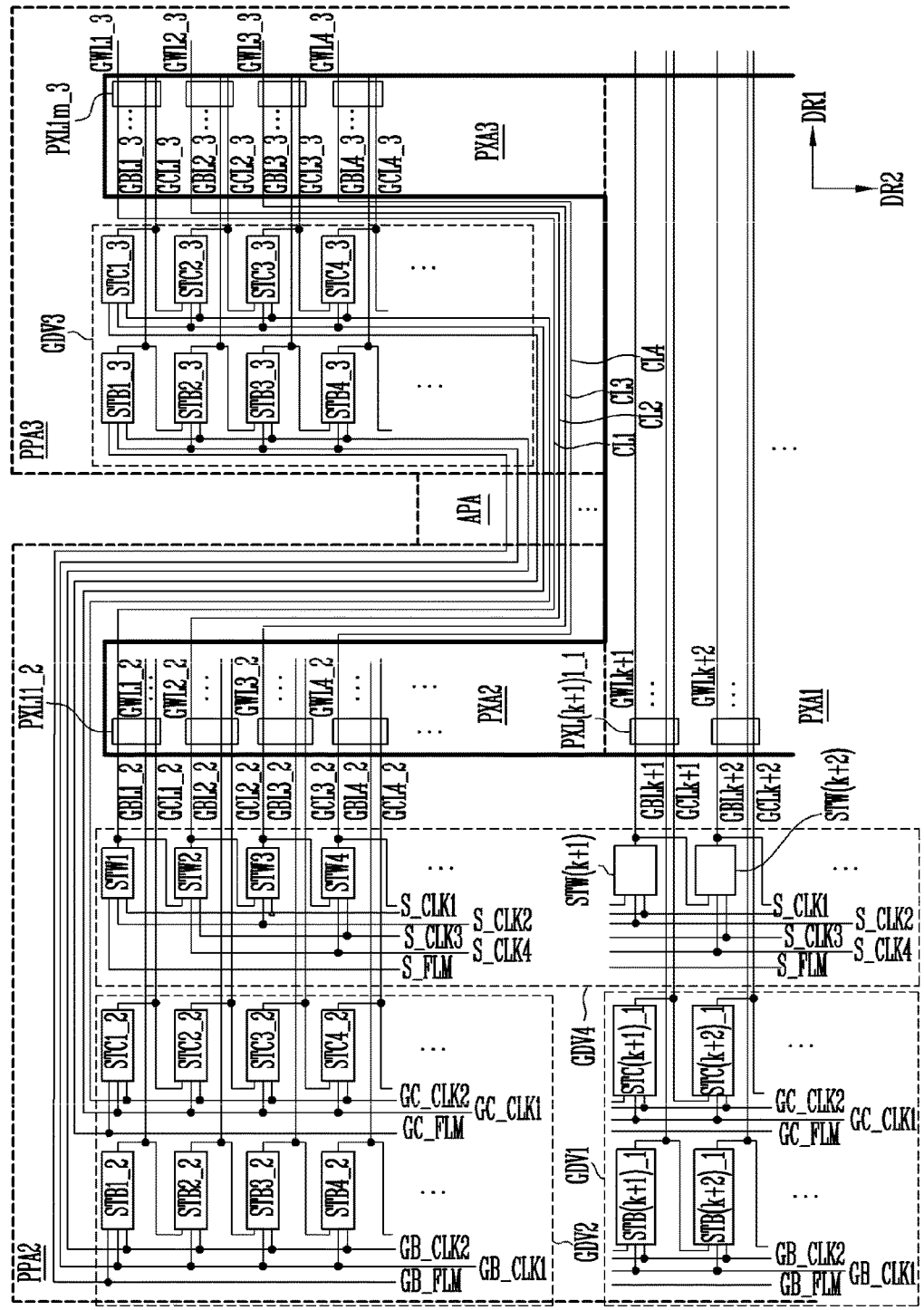
FIG. 6 is a drawing showing an example embodiment of the display device of FIG. 5.

FIG. 6 is a drawing showing an example embodiment of the display device of FIG. 5. In FIG. 6, a portion of the display device DD is briefly shown (e.g., partially shown) based on the first gate driver GDV1, the second gate driver GDV2, the third gate driver GDV3, and the fourth gate driver GDV4, that is, the first scan driver SDV1 (refer to FIG. 1).

Referring to FIGS. 5 and 6, the second gate driver GDV2 may include bypass stages STB1_2, STB2_2, STB3_2, and STB4_2.

The bypass stages STB1_2, STB2_2, STB3_2, and STB4_2 may be coupled (e.g., connected) to the bypass clock signal lines GB_CLK1 and GB_CLK2, and may be coupled (e.g., connected) to the bypass scan lines GBL1_2, GBL2_2, GBL3_2, and GBL4_2, respectively. For example, each of the bypass stages STB1_2, STB2_2, STB3_2, and STB4_2 may be coupled (e.g., connected) to both of the bypass clock signal lines GB_CLK1 and GB_CLK2.

The bypass clock signal lines GB_CLK1 and GB_CLK2 and the bypass start signal line GB_FLM, which will be described later, may be included in the first control signal line CSL1 described with reference to FIG. 5, and may extend from the second peripheral area PPA2 to the third peripheral area PPA3 via (e.g., through or across) the added peripheral area APA. The bypass clock signals may be applied to the bypass clock signal lines GB_CLK1 and GB_CLK2, and the bypass clock signals may have mutually inverted phases (e.g., phases shifted by 180 degrees from each other). A bypass start signal (or first bypass start signal, first start pulse) may be applied to the bypass start signal line GB_FLM.

Each of the bypass stages STB1_2, STB2_2, STB3_2, and STB4_2 may receive a bypass start signal or a bypass scan signal (or bypass carry signal) of the previous bypass stage, and may generate a bypass scan signal corresponding to (e.g., according to, based on, etc.) the bypass start signal or a bypass scan signal of the previous bypass stage (i.e., previous bypass scan signal) utilizing bypass clock signals.

For example, the first bypass stage STB1_2 may receive the bypass start signal through (e.g., from) the bypass start signal line GB_FLM, may generate the first bypass scan signal corresponding to the bypass start signal utilizing the bypass clock signals, and may provide the first bypass scan signal to the first bypass scan line GBL1_2 in the second pixel area PXA2. For example, the first bypass stage STB1_2 may output clock signals (e.g., pulse of a turn-on level) as the first bypass scan signal in response to the bypass start signal. The first bypass scan signal may be provided to an 11-th pixel PXL11_2 in the second pixel area PXA2.

The second bypass stage STB2_2 may receive the first bypass scan signal from the first bypass stage STB1_2, and may generate the second bypass scan signal corresponding to the first bypass scan signal to provide it to the second bypass scan line GBL2_2 in the second pixel area PXA2. Similarly, the third bypass stage STB3_2 may generate a third bypass scan signal corresponding to the second bypass scan signal to provide it to the third bypass scan line GBL3_2 in the second pixel area PXA2, and the fourth bypass stage STB4_2 may generate a fourth bypass scan signal corresponding to the third bypass scan signal to provide it to the fourth bypass scan line GBL4_2 in the second pixel area PXA2.

For example, the bypass stages STB1_2, STB2_2, STB3_2, and STB4_2 may sequentially provide bypass scan signals to the bypass scan lines GBL1_2, GBL2_2, GBL3_2, and GBL4_2.

Also, the second gate driver GDV2 may include compensation stages STC1_2, STC2_2, STC3_2, and STC4_2. The compensation stages STC1_2, STC2_2, STC3_2, and STC4_2 may be disposed more adjacent to (e.g., closer to) the second pixel area PXA2 than the bypass stages STB1_2, STB2_2, STB3_2, and STB4_2, but is not limited thereto. For example, the compensation stages STC1_2, STC2_2, STC3_2, and STC4_2 may be between the second pixel area PXA2 and the bypass stages STB1_2, STB2_2, STB3_2, and STB4_2 in a plan view.

The compensation stages STC1_2, STC2_2, STC3_2, and STC4_2 may be coupled (e.g., connected) to compensation clock signal lines GC_CLK1 and GC_CLK2, and may be coupled (e.g., connected) to the compensation scan lines GCL1_2, GCL2_2, GCL3_2, and GCL4_2 in the second pixel area PXA2, respectively. For example, each of the compensation stages STC1_2, STC2_2, STC3_2, and STC4_2 may be coupled (e.g., connected) to both of the compensation clock signal lines GC_CLK1 and GC_CLK2.

The compensation clock signal lines GC_CLK1 and GC_CLK2 and the compensation start signal line GC_FLM, which will be described later, may be included in the first control signal line CSL1 described with reference to FIG. 5, and may extend from the second peripheral area PPA2 to the third peripheral area PPA3 via the added peripheral area APA. Compensation clock signals may be applied to the compensation clock signal lines GC_CLK1 and GC_CLK2, and the compensation clock signals may have mutually inverted phases (e.g., phases shifted by 180 degrees from each other). A compensation start signal (or second start pulse) may be applied to the compensation start signal line GC_FLM.

Each of the compensation stages STC1_2, STC2_2, STC3_2, and STC4_2 may receive a compensation start signal or a compensation scan signal (or compensation carry signal) of the previous compensation stage, and may generate a compensation scan signal corresponding to a compensation start signal or a compensation scan signal (i.e., previous compensation scan signal) of the previous compensation stage utilizing the compensation clock signals.

For example, the first compensation stage STC1_2 may receive the compensation start signal through the compensation start signal line GC_FLM, may generate a first compensation scan signal corresponding to the compensation start signal utilizing the compensation clock signals, and may provide the first compensation scan signal to the first compensation scan line GCL1_2 in the second pixel area PXA2.

The second compensation stage STC2_2 may receive the first compensation scan signal from the first compensation stage STC1_2, and may generate a second compensation scan signal corresponding to the first compensation scan signal to provide it to the second compensation scan line GCL2_2 in the second pixel area PXA2. Similarly, the third compensation stage STC3_2 may generate a third compensation scan signal corresponding to the second compensation scan signal to provide it to the third compensation scan line GCL3_2 in the second pixel area PXA2, and the fourth compensation stage STC4_2 may generate a fourth compensation scan signal corresponding to the third compensation scan signal to provide it to the fourth compensation scan line GCL4_2 in the second pixel area PXA2.

For example, the compensation stages STC1_2, STC2_2, STC3_2, and STC4_2 may sequentially provide compensation scan signals to the compensation scan lines GCL1_2, GCL2_2, GCL3_2, and GCL4_2.

Meanwhile, the first gate driver GDV1 may include bypass stages STB(k+1)_1 and STB(k+2)_1. Here, k may be a positive integer, and k may be about 100. However, the present disclosure is not limited thereto, and the integer k may be any suitable integer.

The bypass stages STB(k+1)_1 and STB(k+2)_1 may be coupled (e.g., connected) to the bypass clock signal lines GB_CLK1 and GB_CLK2, and may be coupled (e.g., connected) to the bypass scan lines GBLk+1 and GBLk+2, respectively. For example, each of the bypass stages STB(k+1)_1 and STB(k+2)_1 may be coupled (e.g., connected) to both of the bypass clock signal lines GB_CLK1 and GB_CLK2. Here, the k+1-th bypass scan line GBLk+1 may correspond to the bypass scan line GBL_1 described with reference to FIG. 5.

Each of the bypass stages STB(k+1)_1 and STB(k+2)_1 may receive the bypass scan signal (or bypass carry signal) of the previous bypass stage, and may generate a bypass scan signal corresponding to the bypass scan signal of the previous bypass stage utilizing the bypass clock signals.

For example, the k+1-th bypass stage STB(k+1)_1 may receive a bypass scan signal (e.g., k-th bypass scan signal) from the last bypass stage of the second gate driver GVD2, may generate the k+1-th bypass scan signal utilizing the bypass clock signals, and may provide the k+1-th bypass scan signal to the k+1-th bypass scan line GBLk+1 in the first pixel area PXA1. The k+1-th bypass scan signal may be provided to the (k+1)1-th pixel PXL(k+1)1_1 in the first pixel area PXA1.

The k+1-th bypass stage STB(k+1)_1 is described as being to receive the bypass scan signal (e.g., the k-th bypass scan signal) from the last bypass stage of the second gate driver GVD2, but is not limited thereto. For example, similar to the first bypass stage STB1_2 of the second gate driver GDV2, the k+1-th bypass stage STB(k+1)_1 may receive a separate bypass start signal (e.g., a second bypass start signal), and may generate the k+1-th bypass scan signal corresponding to the separate bypass start signal.

Similarly, the k+2-th bypass stage STB(k+2)_1 may receive the k+1-th bypass scan signal from the k+1-th bypass stage STB(k+1)_1, and may generate a k+2-th bypass scan signal corresponding to the k+1-th bypass scan signal to provide it to the k+2-th bypass scan line GBLk+2 in the first pixel area PXA1.

Also, the first gate driver GDV1 may include compensation stages STC(k+1)_1 and STC(k+2)_1.

The compensation stages STC(k+1)_1 and STC(k+2)_1 may be coupled (e.g., connected) to the compensation clock signal lines GC_CLK1 and GC_CLK2, and may be coupled (e.g., connected) to the compensation scan lines GCLk+1 and GCLk+2, respectively. For example, each of the compensation stages STC(k+1)_1 and STC(k+2)_1 may be coupled (e.g., connected) to both of the compensation clock signal lines GC_CLK1 and GC_CLK2, and the compensation stages STC(k+1)_1 and STC(k+2)_1 may be respectively coupled (e.g., connected) to the compensation scan lines GCLk+1 and GCLk+2. Here, the k+1-th compensation scan line GCLk+1 may correspond to the compensation scan line GCL_1 described with reference to FIG. 5.

Each of the compensation stages STC(k+1)_1 and STC(k+2)_1 may receive the compensation scan signal (or compensation carry signal) of the previous compensation stage, and may generate a compensation scan signal corresponding to the compensation scan signal (i.e., previous compensation scan signal) of the previous compensation stage utilizing the compensation clock signals.

For example, the k+1-th compensation stage STC(k+1)_1 may receive the compensation scan signal (e.g., the k-th compensation scan signal) from the last compensation stage of the second gate driver GVD2, may generate the k+1-th compensation scan signal utilizing the compensation clock signals, and may provide the k+1-th compensation scan signal to the k+1-th compensation scan line GCLk+1 in the first pixel area PXA1. In embodiments, similar to the first compensation stage STC1_2 of the second gate driver GDV2, the k+1-th compensation stage STC(k+1)_1 may receive a separate compensation start signal (e.g., a second compensation start signal), and may generate the k+1-th compensation scan signal corresponding to the separate compensation start signal.

Similarly, the k+2-th compensation stage STC(k+2)_1 may receive the k+1-th compensation scan signal from the k+1-th compensation stage STC(k+1)_1, and may generate the k+2-th compensation scan signal corresponding to the k+1-th compensation scan signal to provide it to the k+2-th compensation scan line GCLk+2 in the first pixel area PXA1.

Meanwhile, the third gate driver GDV3 may include bypass stages STB1_3, STB2_3, STB3_3, and STB4_3.

The bypass stages STB1_3, STB2_3, STB3_3, and STB4_3 may be coupled (e.g., connected) to the bypass clock signal lines GB_CLK1 and GB_CLK2, and may be coupled (e.g., connected) to the bypass scan lines GBL1_3, GBL3_3, and GBL4_3, respectively. For example, each of the bypass stages STB1_3, STB2_3, STB3_3, and STB4_3 may be coupled (e.g., connected) to both of the bypass clock signal lines GB_CLK1 and GB_CLK2.

Each of the bypass stages STB1_3, STB2_3, STB3_3, and STB4_3 may receive a bypass start signal or a bypass scan signal (or bypass carry signal) of the previous bypass stage, and may generate a bypass scan signal corresponding to the bypass start signal or the bypass scan signal (i.e., the previous bypass scan signal) of the previous bypass stage utilizing the bypass clock signals.

For example, the first bypass stage STB1_3 may receive the bypass start signal through the bypass start signal line GB_FLM, may generate the first bypass scan signal corresponding to the bypass start signal utilizing the bypass clock signals, and may provide the first bypass scan signal to the first bypass scan line GBL1_3 in the third pixel area PXA3. The first bypass scan signal may be provided to the 1m-th pixel PXL1$m$_3 in the third pixel area PXA3.

Meanwhile, because each of the first bypass stage STB1_3 of the third gate driver GDV3 and the first bypass stage STB1_2 of the second gate driver GDV2 are to generate the first bypass scan signal utilizing the same bypass start signal (e.g., the bypass start signal received through the bypass start signal line GB_FLM) and the same bypass clock signals (e.g., the bypass clock signals received through the bypass clock signal lines GB_CLK1 and GB_CLK2), the bypass scan signal of the same waveform may be provided at the same time point in the 11-th pixel PXL11_2 in the second pixel area PXA2 and the 1m-th pixel PXL1$m$_3 in the third pixel area PXA3.

The second bypass stage STB2_3 may receive the first bypass scan signal from the first bypass stage STB1_3, and may generate the second bypass scan signal corresponding to the first bypass scan signal to provide it to the second bypass scan line GBL2_3 in the third pixel area PXA3. Similarly, the third bypass stage STB3_3 may generate a third bypass scan signal corresponding to the second bypass scan signal to provide it to the third bypass scan line GBL3_3 in the third pixel area PXA3, and the fourth bypass stage STB4_3 may generate a fourth bypass scan signal corresponding to the third bypass scan signal to provide it to the fourth bypass scan line GBL4_3 in the third pixel area PXA3.

For example, the bypass stages STB1_3, STB2_3, STB3_3, and STB4_3 of the third gate driver GDV3 may sequentially provide the bypass scan signals to the bypass scan lines GBL1_3, GBL2_3, GBL3_3, and GBL4_3, respectively, in the third pixel area PXA3.

Also, the third gate driver GDV3 may include compensation stages STC1_3, STC2_3, STC3_3, and STC4_3. The compensation stages STC1_3, STC2_3, STC3_3, and STC4_3 may be disposed more adjacent to the third pixel area PXA3 than the bypass stages STB1_3, STB2_3, STB3_3, and STB4_3, PXA3, but are not limited thereto. For example, in some embodiments, the compensation stages STC1_3, STC2_3, STC3_3, and STC4_3 may be between the third pixel area PXA3 and the bypass stages STB1_3, STB2_3, STB3_3, and STB4_3.

The compensation stages STC1_3, STC2_3, STC3_3, and STC4_3 may be coupled (e.g., connected) to the compensation clock signal lines GC_CLK1 and GC_CLK2, and may be coupled (e.g., connected) to the compensation scan lines GCL1_3, GCL2_3, GCL3_3, and GCL4_3 in the third pixel area PXA3, respectively. For example, each of the compensation stages STC1_3, STC2_3, STC3_3, and STC4_3 may be coupled (e.g., connected) to both of the compensation clock signal lines GC_CLK1 and GC_CLK2.

Each of the compensation stages STC1_3, STC2_3, STC3_3, and STC4_3 may receive a compensation start signal or a compensation scan signal (or compensation carry signal) of the previous compensation stage, and may generate a compensation scan signal corresponding to the compensation start signal or the compensation scan signal (i.e., the previous compensation scan signal) of the previous compensation stage utilizing the compensation clock signals.

For example, the first compensation stage STC1_3 may receive the compensation start signal through (e.g., from) the compensation start signal line GC_FLM, may generate the first compensation scan signal corresponding to the compensation start signal utilizing the compensation clock signals, and may provide the first compensation scan signal to the first compensation scan line GCL1_3 in the third pixel area PXA3.

The second compensation stage STC2_3 may receive the first compensation scan signal from the first compensation stage STC1_3, and may generate the second compensation scan signal corresponding to the first compensation scan signal to provide it to the second compensation scan line GCL2_3 in the third pixel area PXA3. Similarly, the third compensation stage STC3_3 may generate a third compensation scan signal corresponding to the second compensation scan signal to provide it to the third compensation scan line GCL3_3 in the third pixel area PXA3, and the fourth compensation stage STC4_3 may generate a fourth compensation scan signal corresponding to the third compensation scan signal to provide it to the fourth compensation scan line GCL4_3 in the third pixel area PXA3.

For example, the compensation stages STC1_3, STC2_3, STC3_3, and STC4_3 of the third gate driver GDV3 may sequentially provide compensation scan signals to the compensation scan lines GCL1_3, GCL2_3, GCL3_3, and GCL4_3 in the third pixel area PXA3.

Meanwhile, the fourth gate driver GDV4 may include write stages STW1, STW2, STW3, STW4, STW(k+1), and STW(k+2). The write stages STW1, STW2, STW3, STW4, STW(k+1), and STW(k+2) may be disposed more adjacent to the first pixel area PXA1 and the second pixel area PXA2 than the first gate driver GDV1 and the second gate driver GDV2, respectively. For example, the fourth gate driver GDV4 may be between the first pixel area PXA1 and the first gate driver GDV1, and the fourth gate driver GDV4 may be between the second pixel area PXA2 and the second gate driver GDV2. In this case, as shown in FIG. 4, an RC delay of the write scan signal GWn having a relatively small pulse width can be relatively mitigated.

The write stages STW1, STW2, STW3, STW4, STW(k+1), and STW(k+2) may be coupled (e.g., connected) to corresponding two write clock signal lines among the write clock signal lines S_CLK1, S_CLK2, S_CLK3, and S_CLK4, and may be coupled (e.g., connected) to the write scan lines GWL1_2, GWL2_2, GWL3_2, GWL4_2, GWLk+1, GWLk+2, respectively. For example, each of the write stages STW1, STW2, STW3, STW4, STW(k+1), and STW(k+2) may be coupled (e.g., connected) to two from among the write clock signal lines S_CLK1, S_CLK2, S_CLK3, and S_CLK4. Here, the k+1-th write scan line GWLk+1 may correspond to the write scan line GWL_1 described with reference to FIG. 5.

In addition, the write stages STW1, STW2, STW3, and STW4 coupled (e.g., connected) to the write scan lines GWL1_2, GWL2_2, GWL3_2, and GWL4_2 in the second pixel area PXA2 among the write stages STW1, STW2, STW3, STW4, STW(k+1), and STW(k+2), may be coupled (e.g., connected) to the write scan lines GWL1_3, GWL2_3, GWL3_3, and GWL4_3 in the third pixel area PXA3 through the connection lines CL1, CL2, CL3, and CL4, respectively. Here, the connection lines CL1, CL2, CL3, and CL4 may be included in the connection line CL described with reference to FIG. 5.

The write clock signal lines S_CLK1, S_CLK2, S_CLK3, and S_CLK4 may include first to fourth write clock signal lines S_CLK1, S_CLK2, S_CLK3, and S_CLK4, and four write clock signals having sequentially delayed phases (e.g., phases sequentially delayed by 90 degrees) may be applied to the first to fourth write clock signal lines S_CLK1, S_CLK2, S_CLK3, and S_CLK4, respectively.

When the write stages STW1, STW2, STW3, STW4, STW(k+1), and STW(k+2) utilize four write clock signals, write scan signals having a relatively small pulse width can be easily generated compared to a case of utilizing two write clock signals. In some cases, considering the pulse width of the write scan signals, the write clock signal lines may include two write clock signal lines, or six or more write clock signal lines.

Each of the write stages STW1, STW2, STW3, and STW4 may receive a write start signal or a write scan signal (or write carry signal) of the previous write stage, and may generate a write scan signal corresponding to the write start signal or the write scan signal (i.e., previous write scan signal) of the previous write stage utilizing the write clock signals.

For example, the first write stage STW1 may receive the write start signal (or third start pulse) through the write start signal line S_FLM, may generate the first write scan signal corresponding to the write start signal utilizing the write clock signals, and may provide the first write scan signal to the first write scan line GWL1_2 in the second pixel area PXA2. The first write scan signal may be provided to the 11-th pixel PXL11_2 in the second pixel area PXA2. Also, because the first write scan line GWL1_2 is coupled (e.g., connected) to the first write scan line GWL1_3 in the third pixel area PXA3 through the first connection line CL1, the first write scan signal may be provided to the 1m-th pixel PXL1m_3 in the third pixel area PXA3.

The second write stage STW2 may receive the first write scan signal from the first write stage STW1, and may generate the second write scan signal corresponding to the first write scan signal to provide it to the second write scan line GWL2_2 in the second pixel area PXA2. Because the second write scan line GWL2_2 is coupled (e.g., connected) to the second write scan line GWL2_3 in the third pixel area PXA3 through the second connection line CL2, the second write scan signal may be also provided to the second write scan line GWL2_3 in the third pixel area PXA3.

Similarly, the third write stage STW3 may generate the third write scan signal corresponding to the second write scan signal to provide it to the third write scan line GWL3_2 in the second pixel area PXA2, and may also provide the third write scan signal to the third write scan line GWL3_3 in the third pixel area PXA3 through the third connection line CL3. The fourth write stage STW4 may generate the fourth write scan signal corresponding to the third write scan signal to provide it to the fourth write scan line GWL4_2 in the second pixel area PXA2, and may also provide the fourth write scan signal to the fourth write scan line GWL4_3 in the third pixel area PXA3 through the fourth connection line CL4.

In addition, the k+1-th write stage STW(k+1) may generate the k+1-th write scan signal corresponding to the k-th write scan signal to provide it to the k+1-th write scan line GWLk+1 in the first pixel area PXA1, and the k+1-th write scan signal may be provided to the (k+1)1-th pixel PXL(k+1)1_1 in the first pixel area PXA1. The k+2-th write stage STW(k+2) may generate the k+2-th write scan signal corresponding to the k+1-th write scan signal to provide it to the k+2-th write scan line GWLk+2 in the first pixel area PXA1.

For example, the write stages STW1, STW2, STW3, STW4, STW(k+1), and STW(k+2) may sequentially provide the write scan signals to the write scan lines GWL1_2, GWL2_2, GWL3_2, and GWL4_2 in the second pixel area PXA2 and to the write scan lines GWLk+1 and GWLk+2 in the first pixel area PXA1. Also, the write stages STW1, STW2, STW3, and STW4 coupled (e.g., connected) to the write scan lines GWL1_2, GWL2_2, GWL3_2, and GWL4_2 in the second pixel area PXA2 among the write stages STW1, STW2, STW3, STW4, STW(k+1), and STW (k+2), may sequentially provide the write scan signals to the write scan lines GWL1_3, GWL2_3, GWL3_3, and GWL4_3 in the third pixel area PXA3 through the connection lines CL1, CL2, CL3, and CL4.

As described with reference to FIG. 6, the bypass scan signals and the compensation scan signals may be provided to the third pixel area PXA3 through the third gate driver GDV3 that is disposed in a peripheral area (e.g., third peripheral area PPA3) between the second pixel area PXA2 and the third pixel area PXA3. Accordingly, compared to a case where the second gate driver GDV2 provides the bypass scan signals and the compensation scan signals to the third pixel area PXA3 through separate lines, the number of lines provided to the added peripheral area APA may be reduced, and a space for a load matching capacitor, which will be described later, can be sufficiently secured. In addition, lines (e.g., connection lines CL1, CL2, CL3, and CL4) provided on the added peripheral area APA may not be overlapped (e.g., overlapped in a plan view) with each other and may be spaced apart (e.g., spaced apart in a plan view) with a sufficient distance (or separation distance). Accordingly, a phenomenon in which an image (or luminance of an image) displayed in the second and third pixel areas PXA2 and PXA3 is different from an image displayed in the first pixel area PXA1, and defects (e.g., interference, disconnection, etc.) occurring in the connection lines CL1, CL2, CL3, and CL4 can be mitigated or prevented.

In some embodiments, a dummy unit (or dummy pattern, or load matching capacitor) which is coupled (e.g., connected) to the connection lines CL1, CL2, CL3, and CL4, or overlaps the connection lines CL1, CL2, CL3, and CL4 to form parasitic capacitors, respectively, may be provided in the added peripheral area APA.

For reference, the number of pixels coupled (e.g., connected) to the write scan lines GWL1_2, GWL2_2, GWL3_2, and GWL4_2 in the second pixel area PXA2 (and the write scan lines GWL1_3, GWL2_3, GWL3_3, and GWL4_3 in the third pixel area PXA3), may be less than the number of pixels coupled (e.g., connected) to the write scan lines GWLk+1 and GWLk+2 in the first pixel area PXA1. Accordingly, load values of the write scan lines GWL1_2, GWL2_2, GWL3_2, and GWL4_2 in the second pixel area PXA2 (and the write scan lines GWL1_3, GWL2_3, GWL3_3, and GWL4_3 in the third pixel area PXA3), may be smaller than load values of the write scan lines GWLk+1 and GWLk+2 in the first pixel area PXA1. Accordingly, the display device DD (refer to FIG. 2) may compensate the load values of the write scan lines GWL1_2, GWL2_2, GWL3_2, and GWL4_2 in the second pixel area PXA2 (and the write scan lines GWL1_3, GWL2_3, GWL3_3, and GWL4_3 in the third pixel area PXA3) to be the same as or similar to the load values of the write scan lines GWLk+1 and GWLk+2 in the first pixel area PXA1 by utilizing the dummy unit.

Figure 7:
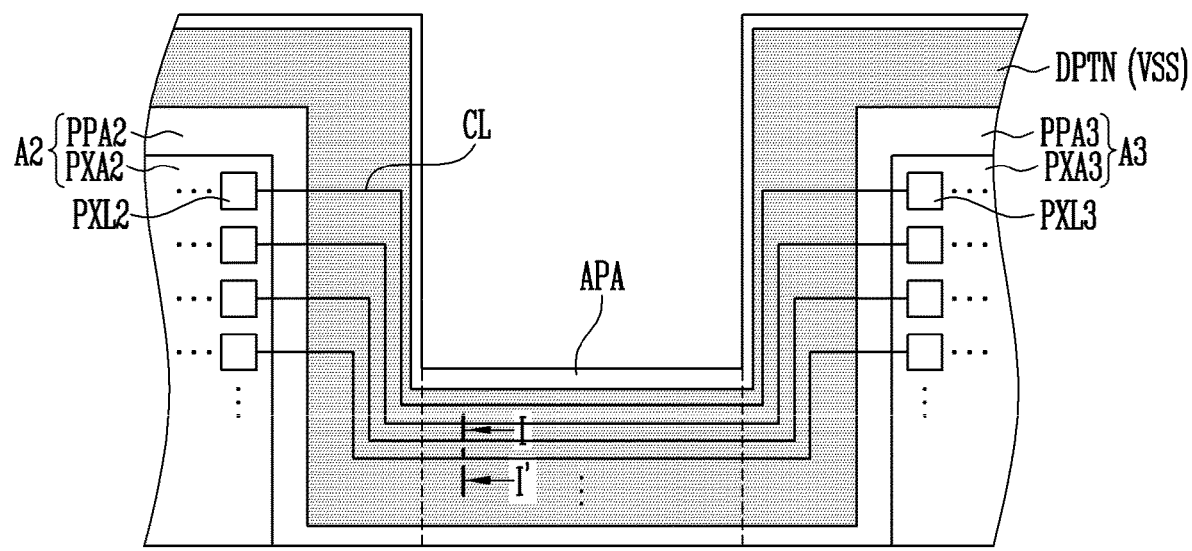
FIG. 7 is a drawing showing an example embodiment of the display device of FIG. 5.
Figure 8:
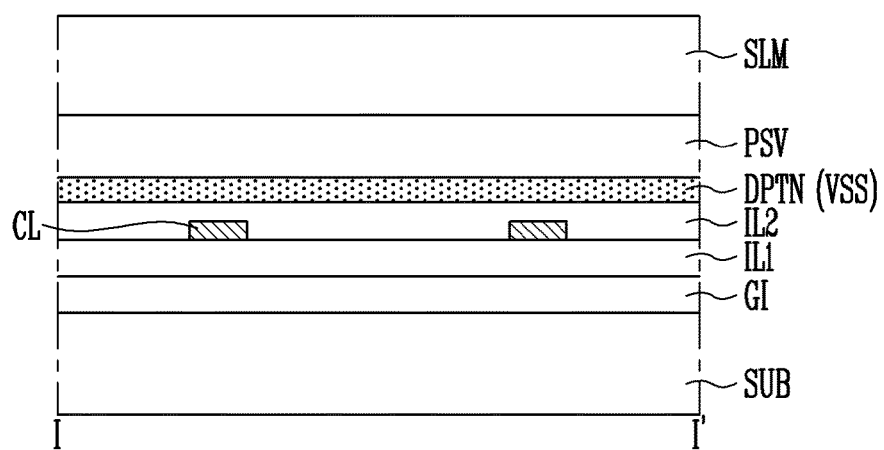
FIG. 8 is a cross-sectional view showing an example embodiment of a display device taken along a line I-I' of FIG. 7.

FIG. 7 is a drawing showing an example embodiment of the display device of FIG. 5. In FIG. 7, a portion of the display device may be briefly shown (e.g., partially shown) based on the added peripheral area APA. FIG. 8 is a cross-sectional view showing an example embodiment of a display device taken along a line I-I' of FIG. 7.

Referring to FIGS. 5, 6, and 7, the connection line CL (or, connection lines CL1, CL2, CL3, and CL4, see FIG. 6) that respectively couples (e.g., connects) the write scan lines GWL1_2, GWL2_2, GWL3_2, and GWL4_2 (see FIG. 6) in the second pixel area PXA2 (or second pixels PXL2) and the write scan lines GWL1_3, GWL2_3, GWL3_3, and GWL4_3 (see FIG. 6) in the third pixel area PXA3 (or third pixels PXL3), may be provided in the added peripheral area APA.

In example embodiments, in the added peripheral area APA, the dummy unit DPTN (or dummy pattern) may overlap the connection line CL. According to an example embodiment, the dummy unit DPTN may overlap the connection line CL in the second peripheral area PPA2 and the third peripheral area PPA3. The dummy unit DPTN may be disposed via (e.g., may overlap or may be disposed at) the second peripheral area PPA2, the third peripheral area PPA3, and the added peripheral area APA.

The dummy unit DPTN may be coupled (e.g., connected) to the second power supply line VSS or the first power supply line VDD (see FIG. 2), or may be one of the second power supply line VSS or the first power supply line VDD (see FIG. 2). For example, the dummy unit DPTN may be the second power supply line VSS, and a second power voltage may be applied to the dummy unit DPTN.

The dummy unit DPTN may overlap the connection line CL to form a parasitic capacitor. The parasitic capacitance of the parasitic capacitor may be to increase a load of the connection line CL (or write scan lines GWL1_2, GWL2_2, GWL3_2, and GWL4_2 (see FIG. 6) in the second pixel area PXA2 and write scan lines GWL1_3, GWL2_3, GWL3_3, and GWL4_3 (see FIG. 6) in the third pixel area PXA3 coupled (e.g., connected) thereto), and may compensate for load values thereof. As a result, the load values of the write scan lines GWL1_2, GWL2_2, GWL3_2, and GWL4_2 (see FIG. 6) in the second pixel area PXA2 and the write scan lines GWL1_3, GWL2_3, GWL3_3, and GWL4_3 (see FIG. 6) in the third pixel area PXA3, may be the same as or similar to the load values of the write scan lines GWLk+1 and GWLk+2 in the first pixel area PXA1. The parasitic capacitance of the parasitic capacitor formed by the dummy unit DPTN may be set differently depending on the load value of the scan lines to be compensated.

Referring to FIG. 8, the display device DD may include a plurality of insulation layers GI, IL1, and IL2 (or insulation films), a passivation layer PSV, and an encapsulation layer SLM sequentially stacked on the substrate SUB.

The dummy unit DPTN (or second power supply line VSS) may be disposed between a second interlayer insulation layer IL2 among the insulation layers GI, IL1, and IL2 and the passivation layer PSV. The connection line CL may be disposed between the insulation layers GI, IL1, and IL2. For example, the connection line CL may be disposed between two selected from among the insulation layers GI, IL1, and IL2. For example, as shown in FIG. 8, the connection line CL may be disposed between the first interlayer insulation layer IL1 and the second interlayer insulation layer IL2.

In this case, a parasitic capacitor (or load matching capacitor) may be formed at a portion where the dummy unit DPTN and the connection line CL overlap.

Meanwhile, in FIG. 8, the dummy unit DPTN is shown to be disposed between the second interlayer insulation layer IL2 and the passivation layer PSV, but is not limited thereto. For example, the display device DD may further include a conductive pattern disposed between the gate insulation layer GI and the first interlayer insulation layer IL1 among the insulation layers GI, IL1, and IL2, and the conductive pattern may be coupled (e.g., connected) to the dummy unit DPTN through a separate contact hole and may overlap the connection line CL to further form parasitic capacitors. In addition, portions (or areas) overlapping the connection line CL may be changed depending on a shape (i.e., shape on or in a top plane view) of the conductive pattern, and accordingly, parasitic capacitances of the parasitic capacitors may be variously and suitably set.

As described with reference to FIGS. 7 and 8, the display device DD may include a parasitic capacitor formed by overlapping the dummy unit DPTN and the connection line CL in the added peripheral area APA, and the parasitic capacitor may compensate for the load of lines (e.g., write scan lines) of the second and third pixel areas PXA2 and PXA3.

Figure 9:
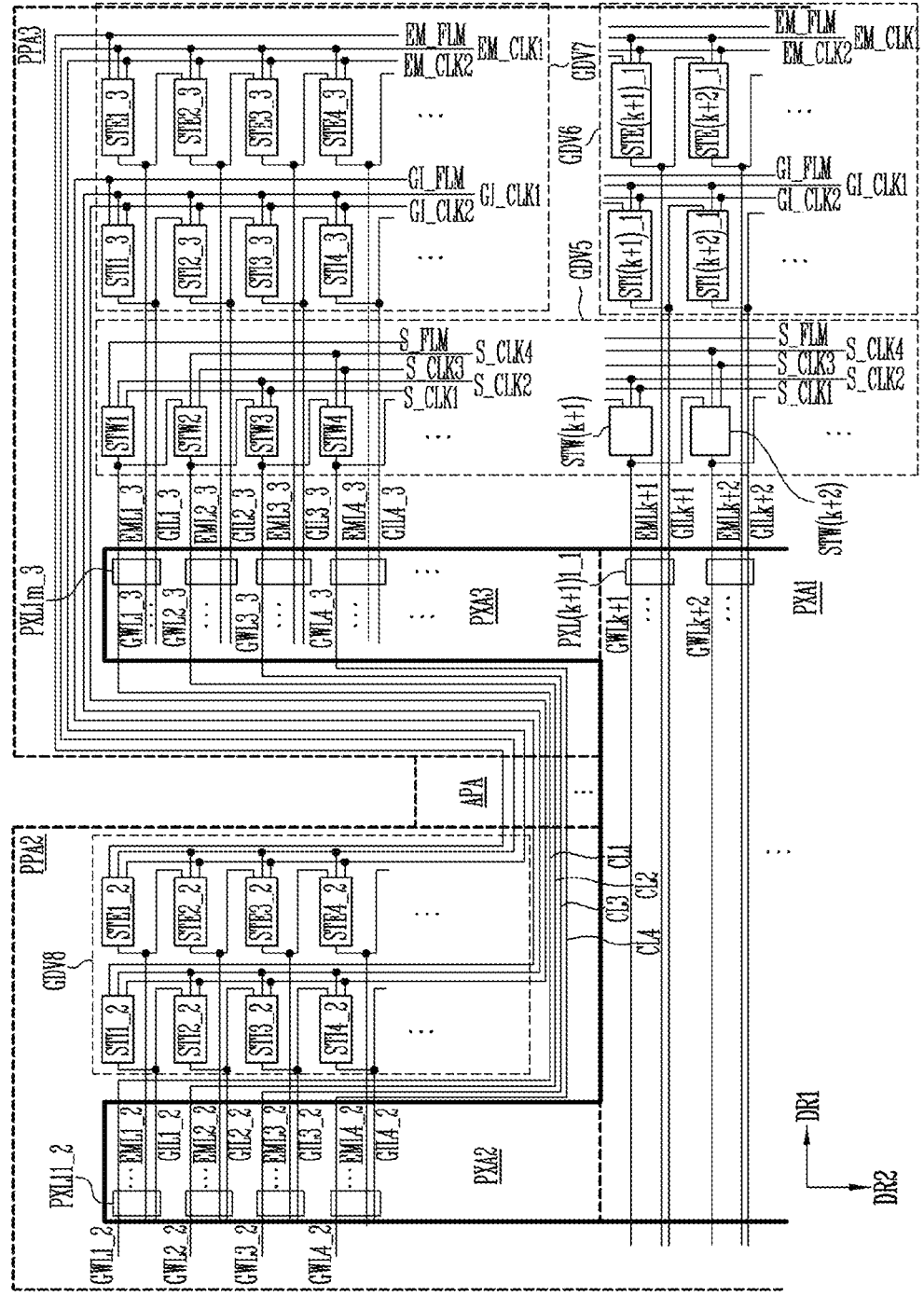
FIG. 9 is a drawing showing an example embodiment of the display device of FIG. 5.

FIG. 9 is a drawing showing an example embodiment of the display device of FIG. 5. In FIG. 9, a portion of the display device DD is shown briefly (e.g., partially shown) based on the fifth gate driver GDV5, the sixth gate driver GDV6, the seventh gate driver GDV7, and the eighth gate driver GDV8, for example, the second scan driver SDV2 (see FIG. 1).

Referring to FIGS. 5 and 9, the fifth gate driver GDV5 may include write stages STW1, STW2, STW3, STW4, STW(k+1), and STW(k+2). Because the write stages STW1, STW2, STW3, STW4, STW(k+1), and STW(k+2) are substantially the same as or similar to the write stages STW1, STW2, STW3, STW4, STW(k+1), and STW(k+2) of the fourth gate driver GDV4 described with reference to FIG. 6, duplicate descriptions may not be repeated.

The fifth gate driver GDV5 may be disposed more adjacent to the first pixel area PXA1 and the third pixel area PXA3 than the sixth gate driver GDV6 and the seventh gate driver GDV7, respectively. For example, the fifth gate driver GDV5 may be between the first pixel area PXA1 and the sixth gate driver GDV6, and the fifth gate driver GDV5 may be between the third pixel area PXA3 and the seventh gate driver GDV7. In this case, as shown in FIG. 4, an RC delay of the write scan signal GWn having a relatively small pulse width can be relatively mitigated. In addition, the fifth gate driver GDV5 may apply write scan signals to the write scan lines GWL1_3, GWL2_3, GWL3_3, GWL4_3, GWLk+1, and GWLk+2 together with the fourth gate driver GDV4, and accordingly, an RC delay of the write scan signals can be minimized or reduced.\

The seventh gate driver GDV7 may include initialization stages STI1_3, STI2_3, STI3_3, and STI4_3.

The initialization stages STI1_3, STI2_3, STI3_3, and STI4_3 may be coupled (e.g., connected) to the initialization clock signal lines GI_CLK1 and GI_CLK2, and may be coupled (e.g., connected) to the initialization scan lines GIL1_3, GIL2_3, GIL3_3, and GIL4_3, respectively. For example, each of the initialization stages STI1_3, STI2_3, STI3_3, and STI4_3 may be coupled (e.g., connected) to both of the initialization clock signal lines GI_CLK1 and GI_CLK2.

The initialization clock signal lines GI_CLK1 and GI_CLK2 and the initialization start signal line GI_FLM, which will be described later, may be included in the second control signal line CSL2 described with reference to FIG. 5, and may extend from the third peripheral area PPA3 to the second peripheral area PPA2 via (e.g., through) the added peripheral area APA. Initialization clock signals may be applied to the initialization clock signal lines GI_CLK1 and GI_CLK2, and an initialization start signal (or first initialization start signal, or fourth start pulse) may be applied to the initialization start signal line GI_FLM.

Each of the initialization stages STI1_3, STI2_3, STI3_3, and STI4_3 may receive an initialization start signal or an initialization scan signal (or initialization carry signal) of the previous initialization stage, and may generate an initialization scan signal corresponding to the initialization start signal or the initialization scan signal (i.e., the previous initialization scan signal) of the previous initialization stage utilizing the initialization clock signals.

For example, the first initialization stage STI1_3 may receive the initialization start signal through (e.g., from) the initialization start signal line GI_FLM, may generate a first initialization scan signal corresponding to the initialization start signal utilizing the initialization clock signals, and may provide the first initialization scan signal to the first initialization scan line GIL1_3 in the third pixel area PXA3.

The second initialization stage STI2_3 may receive the first initialization scan signal from the first initialization stage STI1_3, and may generate a second initialization scan signal corresponding to the first initialization scan signal to provide it to the second initialization scan line GIL2_3 in the third pixel area PXA3. Similarly, the third initialization stage STI3_3 may generate a third initialization scan signal corresponding to the second initialization scan signal to provide it to the third initialization scan line GIL3_3 in the third pixel area PXA3, and the fourth initialization stage STI4_2 may generate a fourth initialization scan signal corresponding to the third initialization scan signal to provide it to the fourth initialization scan line GIL4_3 in the third pixel area PXA3.

Also, the seventh gate driver GDV7 may include light emission stages STE1_3, STE2_3, STE3_3, and STE4_3.

The light emission stages STE1_3, STE2_3, STE3_3, and STE4_3 may be coupled (e.g., connected) to the light emission clock signal lines EM_CLK1 and EM_CLK2, and may be coupled (e.g., connected) to the light emission scan lines EML1_3, EML2_3, EML3_3, and EML4_3 in the third pixel area PXA3, respectively. For example, each of the light emission stages STE1_3, STE2_3, STE3_3, and STE4_3 may be coupled (e.g., connected) to both of the light emission clock signal lines EM_CLK1 and EM_CLK2.

The light emission clock signal lines EM_CLK1 and EM_CLK2 and the light emission stop signal line EM_FLM, which will be described later, may be included in the second control signal line CSL2 described with reference to FIG. 5, and may extend from the third peripheral area PPA3 to the second peripheral area PPA2 via (e.g., through) the added peripheral area APA. The light emission clock signals may be applied to the light emission clock signal lines EM_CLK1 and EM_CLK2, and the light emission stop signal (or fifth start pulse) may be applied to the light emission stop signal line EM_FLM.

Each of the light emission stages STE1_3, STE2_3, STE3_3, and STE4_3 may receive the light emission stop signal or the light emission scan signal (or light emission carry signal) of the previous light emission stage, and may generate a light emission scan signal corresponding to the light emission stop signal or the light emission scan signal (i.e., the previous light emission scan signal) of the previous light emission stage utilizing the light emission clock signals.

Because the operations of the light omitting emission stages STE1_3, STE2_3, STE3_3, and STE4_3 are substantially the same as or similar to those of the initialization stages STI1_3, STI2_3, STI3_3, and STI4_3, duplicate descriptions may not be repeated.

For example, the light emission stages STE1_1, STE2_3, STE3_3, and STE4_3 may sequentially provide light emission scan signals to the light emission scan lines EML1_3, EML2_3, EML3_3, and EML4_3.

Meanwhile, the sixth gate driver GDV6 may include initialization stages STI(k+1)_1 and STI(k+2)_1.

The initialization stages STI(k+1)_1 and STI(k+2)_1 may be coupled (e.g., connected) to the initialization clock signal lines GI_CLK1 and GI_CLK2, and may be coupled (e.g., connected) to the initialization scan lines GILk+1 and GILk+2, respectively. Here, the k+1-th initialization scan line GILk+1 may correspond to the initialization scan line GIL_1 described with reference to FIG. 5.

Each of the initialization stages STI(k+1)_1 and STI(k+2)_1 may receive an initialization scan signal (or initialization carry signal) of the previous initialization stage, and may generate an initialization scan signal corresponding to the initialization scan signal of the previous initialization stage utilizing the initialization clock signals.

Because the operation of each of the initialization stages STI(k+1)_1 and STI(k+2)_1 is substantially the same as or similar to that of the second initialization stage STI2_3, duplicate descriptions may not be repeated.

For example, the initialization stages STI(k+1)_1 and STI(k+2)_1 may sequentially provide the initialization scan signals to the initialization scan lines GILk+1 and GILk+2 in the first pixel area PXA1.

Also, the sixth gate driver GDV6 may include light emission stages STE(k+1)_1 and STE(k+2)_1.

The light emission stages STE(k+1)_1 and STE(k+2)_1 may be coupled (e.g., connected) to the light emission clock signal lines EM_CLK1 and EM_CLK2, and may be coupled (e.g., connected) to the light emission scan lines EMLk+1 and EMLk+2, respectively. For example, each of the light emission stages STE(k+1)_1 and STE(k+2)_1 may be coupled (e.g., connected) to both of the light emission clock signal lines EM_CLK1 and EM_CLK2.

Each of the light emission stages STE(k+1)_1 and STE(k+2)_1 may receive the light emission scan signal (or light emission carry signal) of the previous light emission stage, and may generate a light emission scan signal corresponding to the light emission scan signal (i.e., the previous light emission scan signal) of the previous light emission stage utilizing the light emission clock signals.

Because the operation of each of the light emitting stages STE(k+1)_1 and STE(k+2)_1 is substantially the same as or similar to the operation of each of the light emitting stages STE1_3, STE2_3, STE3_3, and STE4_3 corresponding to the third pixel area PXA3, duplicate descriptions may not be repeated.

For example, the light emission stages STE(k+1)_1 and STE(k+2)_1 may sequentially provide the light emission scan signals to the light emission scan lines EMLk+1 and EMLk+2 in the first pixel area PXA1.

The eighth gate driver GDV8 may include initialization stages STI1_2, STI2_2, STI3_2, and STI4_2.

The initialization stages STI1_2, STI2_2, STI3_2, and STI4_2 may be coupled (e.g., connected) to the initialization clock signal lines GI_CLK1 and GI_CLK2, and may be coupled (e.g., connected) to initialization scan lines GIL1_2, GIL2_2, GIL3_2, and GIL4_2, respectively. For example, each of the initialization stages STI1_2, STI2_2, STI3_2, and STI4_2 may be coupled (e.g., connected) to both of the initialization clock signal lines GI_CLK1 and GI_CLK2.

Because the operations of the initialization stages STI1_2, STI2_2, STI3_2, and STI4_2 are substantially the same as or similar to the operations of the initialization stages STI1_3, STI2_3, STI3_3, and STI4_3 corresponding to the third pixel area PXA3, duplicate descriptions may not be repeated.

For example, the initialization stages STI1_2, STI2_2, STI3_2, and STI4_2 of the eighth gate driver GDV8 may sequentially provide the initialization scan signals to the initialization scan lines GIL1_2, GIL2_2, GIL3_2, and GIL4_2 in the second pixel area PXA2.

Also, the eighth gate driver GDV8 may include light emission stages STE1_2, STE2_2, STE3_2, and STE4_2.

The light emission stages STE1_2, STE2_2, STE3_2, and STE4_2 may be coupled (e.g., connected) to the light emission clock signal lines EM_CLK1 and EM_CLK2, and may be coupled (e.g., connected) to the light emission scan lines EML1_2, EML2_2, EML3_2, and EML4_2 in the second pixel area PXA2. For example, each of the light emission stages STE1_2, STE2_2, STE3_2, and STE4_2 may be coupled (e.g., connected) to both of the light emission clock signal lines EM_CLK1 and EM_CLK2.

Because the operations of the light emission stages STE1_2, STE2_2, STE3_2, and STE4_2 are substantially the same as or similar to the operations of the light emission stages STE1_3, STE2_3, STE3_3, and STE4_3 corresponding to the third pixel area PXA3, duplicate descriptions may not be repeated.

For example, the light emission stages STE1_2, STE2_2, STE3_2, and STE4_2 of the eighth gate driver GDV8 may sequentially provide the light emission scan signals to the light emission scan lines EML1_2, EML2_2, EML3_2, and EML4_2 in the second pixel area PXA2.

As described with reference to FIG. 9, the initialization scan signals and the light emission scan signals may be provided to the second pixel area PXA2 through the eighth gate driver GDV8 disposed on a peripheral area (e.g., second peripheral area PPA2) between the second pixel area PXA2 and the third pixel area PXA3. Accordingly, compared to a case where the seventh gate driver GDV7 provides the initialization scan signals and the light emission scan signals to the second pixel area PXA2 through separate lines, the number of lines provided to (e.g., in) the added peripheral area APA may be reduced, and a space for the dummy unit DPTN (or load matching capacitor) described with reference to FIGS. 7 and 8, and a distance between lines (e.g., connection lines CL1, CL2, CL3, and CL4) provided to the added peripheral area APA, may be sufficiently secured (e.g., may be sufficiently large). Accordingly, a phenomenon in which an image (or luminance of an image) displayed in the second and third pixel areas PXA2 and PXA3 is different from an image displayed in the first pixel area PXA1, and defects (e.g., interference, disconnection, etc.) occurring in the connection lines CL1, CL2, CL3, and CL4 can be mitigated or prevented.

Figure 10:
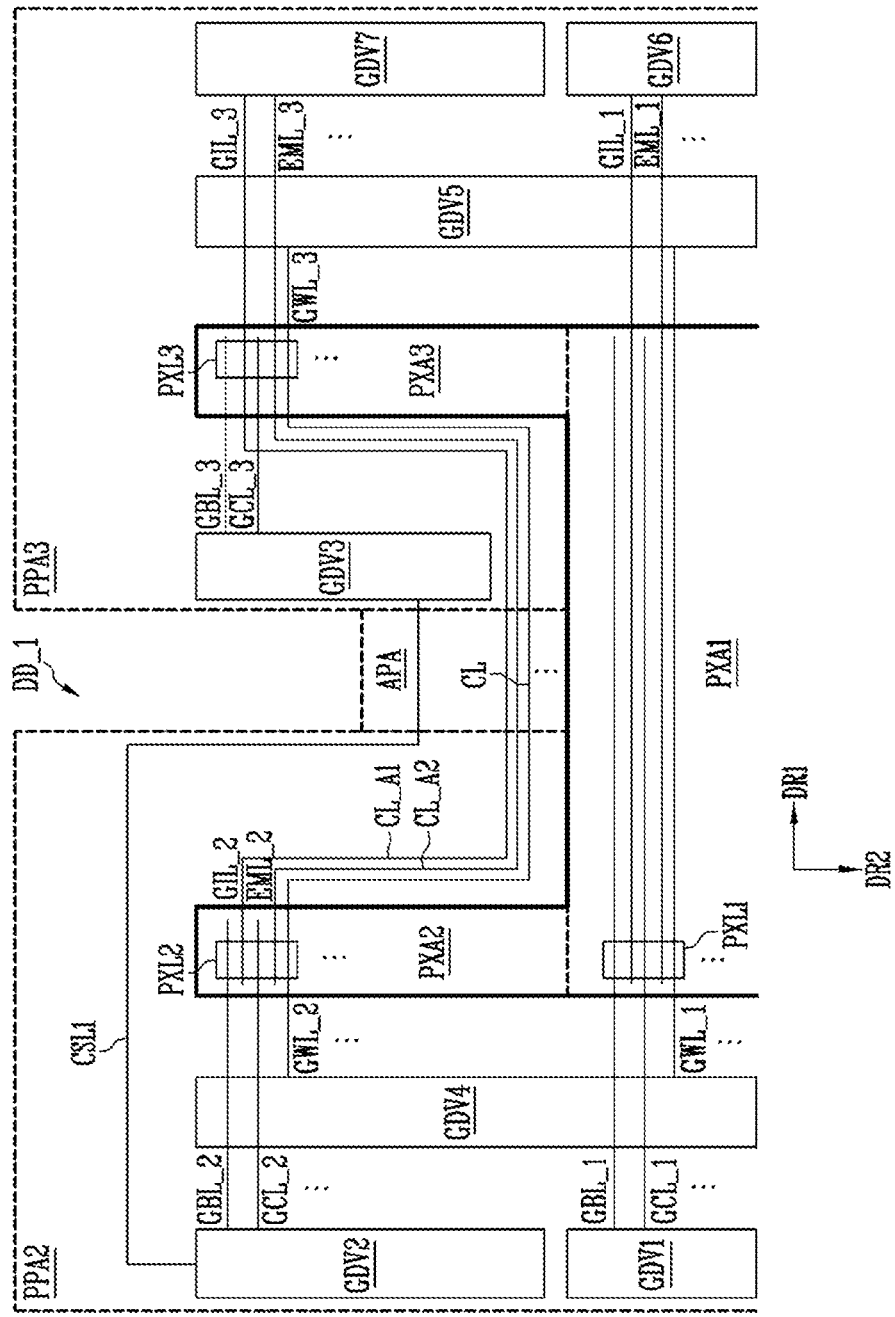
FIG. 10 is a drawing showing another example embodiment of the display device of FIG. 2.

FIG. 10 is a drawing showing another example embodiment of the display device of FIG. 2.

Referring to FIGS. 2, 5, and 10, the display device DD_1 of FIG. 10 is different from the display device DD of FIG. 5 in that it does not include the eighth gate driver GDV8 and further includes added connection lines CL_A1 and CL_A2. Because the display device DD_1 of FIG. 10 is substantially the same as or similar to the display device DD of FIG. 5 except for the added connection lines CL_A1 and CL_A2, duplicate descriptions may not be repeated.

Similarly to the connection line CL, the added connection lines CL_A1 and CL_A2 may extend from the second pixel area PXA2 to the third pixel area PXA3 via (e.g., through or across) the added peripheral area APA.

The initialization scan line GIL_2 (or second initialization scan line) and the light emission scan line EML_2 (or second light emission scan line) provided on the second pixel area PXA2 may be respectively coupled (e.g., connected) to the initialization scan line GIL_3 (or third initialization scan line) and the light emission scan line EML_3 (or third light emission scan line) provided to (e.g., provided on or in) the third pixel area PXA3 through the added connection lines CL_A1 and CL_A2.

For example, the initialization scan line GIL_2 in the second pixel area PXA2 may be coupled (e.g., connected) to the initialization scan line GIL_3 in the third pixel area PXA3 through a first added connection line CL_A1 of the added connection lines CL_A1 and CL_A2. For example, the light emission scan line EML_2 in the second pixel area PXA2 may be coupled (e.g., connected) to the light emission scan line EML_3 (or third light emission scan line) in the third pixel area PXA3 through a second added connection line CL_A2 of the added connection lines CL_A1 and CL_A2.

In this case, the seventh gate driver GDV7 may be coupled (e.g., connected) to the initialization scan line GIL_2 in the second pixel area PXA2 through the initialization scan line GIL_3 in the third pixel area PXA3 and the first added connection line CL_A1, and may provide the initialization scan signal to the second pixel PXL2. Similarly, the seventh gate driver GDV7 may be coupled (e.g., connected) to the light emission scan line EML_2 in the second pixel area PXA2 through the light emission scan line EML_3 in the third pixel area PXA3 and the second added connection line CL_A2, and may provide the light emission scan signal to the second pixel PXL2.

When a width (or length) of the peripheral area (or added peripheral area APA) in the first direction DR1 is more limited (e.g., is sufficiently or relatively small) between the second pixel area PXA2 and the third pixel area PXA3, the display device DD_1 may provide the initialization scan signal and the light emission scan signal to the second pixel area PXA2 utilizing the seventh gate driver GDV7 instead of the eighth gate driver GDV8 (see FIG. 5).

Figure 11:
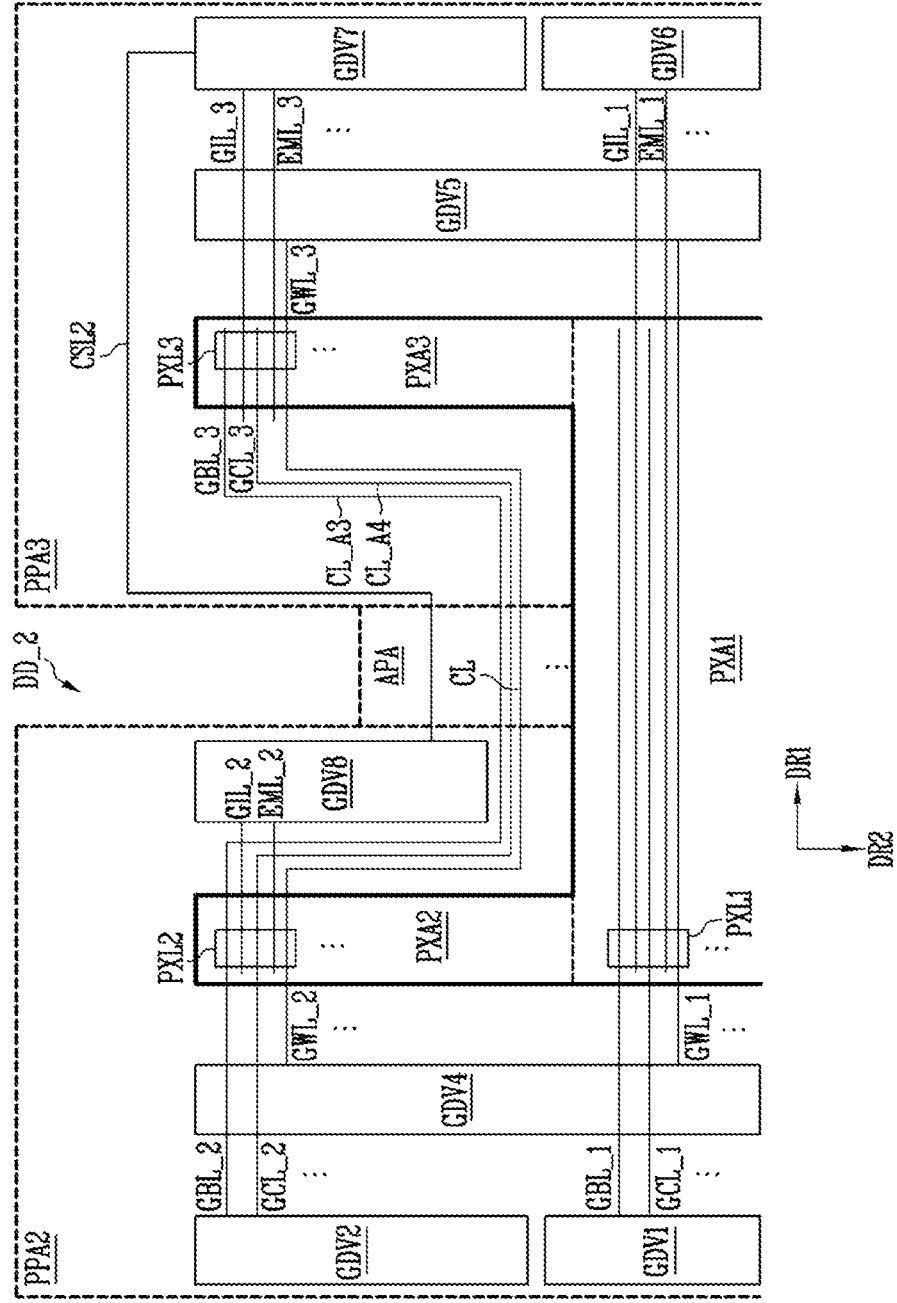
FIG. 11 is a drawing showing another example embodiment of the display device of FIG. 2.

FIG. 11 is a drawing showing another example embodiment of the display device of FIG. 2.

Referring to FIGS. 2, 5, and 11, the display device DD_2 of FIG. 11 is different from the display device DD of FIG. 5 in that it does not include the third gate driver GDV3 and further includes added connection lines CL_A3 and CL_A4. Because the display device DD_2 of FIG. 11 is substantially the same as or similar to the display device DD of FIG. 5 except for the added connection lines CL_A3 and CL_A4, duplicate descriptions may not be repeated.

Similarly to the connection line CL, the added connection lines CL_A3 and CL_A4 may extend from the second pixel area PXA2 to the third pixel area PXA3 via (e.g., through or across) the added peripheral area APA.

The bypass scan line GBL_3 (or third bypass scan line) and the compensation scan line GCL_3 (or third compensation scan line) provided on the third pixel area PXA3 may be respectively coupled (e.g., connected) to the bypass scan line GBL_2 (or second bypass scan line) and the compensation scan line GCL_2 (or second compensation scan line) provided to (e.g., provided on or in) the second pixel area PXA2 through the added connection lines CL_A3 and CL_A4.

For example, the bypass scan line GBL_3 in the third pixel area PXA3 may be coupled (e.g., connected) to the bypass scan line GBL_2 in the second pixel area PXA2 through a third added connection line CL_A3 of the added connection lines CL_A3 and CL_A4. For example, the compensation scan line GCL_3 in the third pixel area PXA3 may be coupled (e.g., connected) to the compensation scan line GCL_2 in the second pixel area PXA2 through a fourth added connection line CL_A4 of the added connection lines CL_A3 and CL_A4.

In this case, the second gate driver GDV2 may be coupled (e.g., connected) to the bypass scan line GBL_3 in the third pixel area PXA3 through the bypass scan line GBL_2 in the second pixel area PXA2 and the third added connection line CL_A3, and may provide the bypass scan signal to the third pixel PXL3. Similarly, the second gate driver GDV2 may be coupled (e.g., connected) to the compensation scan line GCL_3 in the third pixel area PXA3 through the compensation scan line GCL_2 in the second pixel area PXA2 and the fourth added connection line CL_A4, and may provide the compensation scan signal to the third pixel PXL3.

When a width (or length) of the peripheral area (or added peripheral area APA) in the first direction DR1 is more limited (e.g., is sufficiently or relatively small) between the second pixel area PXA2 and the third pixel area PXA3, the display device DD_2 may provide the bypass scan signal and the compensation scan signal to the third pixel area PXA3 utilizing the second gate driver GDV2 instead of the third gate driver GDV3 (see FIG. 5).

While the present disclosure has been shown and described with reference to example embodiments thereof, it will be understood by those of ordinary skill in the art that various suitable changes in forms and details may be made therein without departing from the spirit and scope of the present disclosure as defined by the appended claims and equivalents thereof.

Accordingly, the technical scope of the present disclosure may be determined by the technical scope of the accompanying claims and equivalents thereof.

What is claimed is:

1. A display device comprising:
   a substrate which has a trench portion recessed inward at a side, and which comprises a display area comprising a first display area, a second display area and a third display area, the second and third display areas being protruded from a first side of the first display area with the trench portion interposed therebetween, and a peripheral area around the display area;
   first pixels on the first display area;
   second pixels on the second display area;
   third pixels on the third display area;
   first gate lines on the first display area and coupled to the first pixels;
   second gate lines on the second display area and coupled to the second pixels;
   third gate lines on the third display area and coupled to the third pixels;
   a first gate driver to sequentially provide first gate signals to the first gate lines;
   a second gate driver to sequentially provide second gate signals to the second gate lines; and
   a third gate driver to sequentially provide third gate signals to the third gate lines,
   wherein the third gate driver is on the peripheral area between the second display area and the third display area and is coupled to the second date driver via a first control line.

2. The display device of claim 1, wherein the first gate lines, the second gate lines, and the third gate lines extend in a first direction, and wherein the second display area and the third display area are spaced apart from each other in the first direction.

3. The display device of claim 2, further comprising first control lines comprising the first control line, extending through the peripheral area between the second display area and the third display area, and coupled to the second gate driver and the third gate driver.

4. The display device of claim 3, wherein the second gate driver is to generate a second gate signal of the second gate signals corresponding to a first start pulse utilizing first clock signals provided through the first control lines, and
wherein the third gate driver is to generate a third gate signal of the third gate signals corresponding to a second start pulse utilizing the first clock signals provided through the first control lines.

5. The display device of claim 4, wherein the second start pulse is the same as the first start pulse, and the second start pulse is provided to the third gate driver through one of the first control lines.

6. The display device of claim 2, wherein the second gate lines and the third gate lines are separated from each other with the trench portion interposed therebetween.

7. A display device comprising:
a substrate which has a trench portion recessed inward at a side, and which comprises a display area comprising a first display area, a second display area and a third display area, the second and third display areas being protruded from a first side of the first display area with the trench portion interposed therebetween, and a peripheral area around the display area;
first pixels on the first display area;
second pixels on the second display area;
third pixels on the third display area;
first date lines on the first display area and coupled to the first pixels;
second date lines on the second display area and coupled to the second pixels;
third date lines on the third display area and coupled to the third pixels;
fourth gate lines on the first display area and coupled to the first pixels;
fifth gate lines on the second display area and coupled to the second pixels;
sixth gate lines on the third display area and coupled to the third pixels;
connection lines on the peripheral area between the second display area and the third display area and coupling the fifth gate lines and the sixth gate lines with each other;
a first date driver to sequentially provide first date signals to the first date lines;
a second gate driver to sequentially provide second gate signals to the second gate lines;
a third gate driver to sequentially provide third gate signals to the third gate lines; and
a fourth gate driver to sequentially provide fourth gate signals to the fifth gate lines and the fourth gate lines,
wherein the third gate driver is on the peripheral area between the second display area and the third display area.

8. The display device of claim 7, further comprising a dummy pattern overlapping the connection lines to form a capacitor.

9. The display device of claim 8, further comprising:
a power supply line commonly coupled to the first pixels, the second pixels, and the third pixels,
wherein the dummy pattern is coupled to the power supply line.

10. The display device of claim 7, further comprising a fifth gate driver to sequentially provide fifth gate signals to the sixth gate lines and the fourth gate lines.

11. The display device of claim 10, wherein the fourth gate driver is adjacent to a second side of the first display area and a second side of the second display area, and
wherein the fifth gate driver is adjacent to a third side of the first display area and a third side of the third display area.

12. The display device of claim 7, further comprising:
seventh gate lines on the first display area and coupled to the first pixels;
eighth gate lines on the second display area and coupled to the second pixels;
ninth gate lines on the third display area and coupled to the third pixels;
a sixth gate driver to sequentially provide sixth gate signals to the seventh gate lines;
a seventh gate driver to sequentially provide seventh gate signals to the ninth gate lines; and
an eighth gate driver to sequentially provide eighth gate signals to the eighth gate lines,
wherein the eighth gate driver is on the peripheral area between the second display area and the third display area.

13. The display device of claim 12, wherein the second gate driver is adjacent to a second side of the second display area,
wherein the third gate driver is adjacent to a second side of the third display area,
wherein the seventh gate driver is adjacent to a third side of the third display area, and
wherein the eighth gate driver is adjacent to a third side of the second display area.

14. The display device of claim 12, further comprising second control lines extending through the peripheral area between the second display area and the third display area and coupled to the seventh gate driver and the eighth gate driver.

15. The display device of claim 14, wherein the seventh gate driver is to generate a seventh gate signal of the seventh gate signals corresponding to a third start pulse utilizing second clock signals provided through the second control lines, and
wherein the eighth gate driver is to generate an eighth gate signal of the eighth gate signals corresponding to a fourth start pulse utilizing the second clock signals provided through the second control lines.

16. The display device of claim 15, wherein the fourth start pulse is the same as the third start pulse, and the fourth start pulse is provided to the eighth gate driver through one of the second control lines.

17. The display device of claim 12, further comprising a first data line, a first power supply line, a second power supply line, and a first initialization line,
wherein a first pixel, which is one of the first pixels, comprises:
a light emitting element coupled to both and being between the first power supply line and the second power supply line;
a driving transistor to transfer a driving current to the light emitting element and comprising a first electrode, a second electrode, and a gate electrode;
a switching transistor comprising a first electrode coupled to the first data line, a second electrode coupled to the first electrode of the driving transistor, and a gate electrode coupled to one of the fourth gate lines;

a compensation transistor comprising a first electrode coupled to the second electrode of the driving transistor, a second electrode coupled to the gate electrode of the driving transistor, and a gate electrode coupled to one of the first gate lines; and an initialization transistor comprising a first electrode coupled to the gate electrode of the driving transistor, the second electrode coupled to the first initialization line, and a gate electrode coupled to one of the seventh gate lines.

18. The display device of claim 17, further comprising a third power supply line, wherein the first pixel further comprises:

a first bypass transistor comprising a first electrode coupled to the third power supply line, a second electrode coupled to the first electrode of the driving transistor, and a gate electrode coupled to one of the first gate lines; and a first light emission transistor comprising a first electrode coupled to the first power supply line, a second electrode coupled to the first electrode of the driving transistor, and a gate electrode coupled to one of the seventh gate lines.

19. The display device of claim 18, further comprising a second initialization line, wherein the first pixel further comprises:

a second light emission transistor comprising a first electrode coupled to the second electrode of the driving transistor, a second electrode coupled to an anode electrode of the light emitting element, and a gate electrode coupled to one of the seventh gate lines; and a second bypass transistor comprising a first electrode coupled to the anode electrode of the light emitting element, a second electrode coupled to the second initialization line, and a gate electrode coupled to one of the first gate lines.

20. A display device comprising:

a substrate comprising a first display area, a second display area and a third display area, the second and third display areas being protruded from a first side of the first display area and spaced apart from each other, and a peripheral area between the second display area and the third display area;

first pixels on the first display area;

second pixels on the second display area;

third pixels on the third display area;

first gate lines on the first display area and coupled to the first pixels;

second gate lines on the second display area and coupled to the second pixels;

third gate lines on the third display area and coupled to the third pixels;

a first gate driver to sequentially provide first gate signals to the first gate lines;

a second gate driver to sequentially provide second gate signals to the second gate lines; and a third gate driver to sequentially provide third gate signals to the third gate lines, wherein the third gate driver is on the peripheral area between the second display area and the third display area and is coupled to the second gate driver via a first control line.

\* \* \* \* \*